US012615834B2

(12) United States Patent
Liang et al.

(10) Patent No.: US 12,615,834 B2
(45) Date of Patent: Apr. 28, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Zheng-Yong Liang, Kaohsiung (TW); Wei-Ting Yeh, Hsinchu (TW); Fu-Ting Yen, Hsinchu (TW); Hung-Yu Yen, Taipei (TW); Chien-Hung Lin, Taoyuan (TW); Kuei-Lin Chan, Hsinchu (TW); Yu-Yun Peng, Hsinchu (TW); Keng-Chu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 389 days.

(21) Appl. No.: 18/487,092

(22) Filed: Oct. 15, 2023

(65) Prior Publication Data

US 2025/0126870 A1 Apr. 17, 2025

(51) Int. Cl.
| | |
|---|---|
| *H01L 21/3115* | (2006.01) |
| *H10D 30/43* | (2025.01) |
| *H10D 30/67* | (2025.01) |
| *H10D 62/10* | (2025.01) |
| *H10D 64/01* | (2025.01) |
| *H10D 64/23* | (2025.01) |

(52) U.S. Cl.
CPC ....... *H10D 64/258* (2025.01); *H01L 21/3115* (2013.01); *H10D 30/43* (2025.01); *H10D 30/6735* (2025.01); *H10D 30/6757* (2025.01); *H10D 62/121* (2025.01); *H10D 64/021* (2025.01)

(58) Field of Classification Search
CPC .. H10D 64/258; H10D 30/43; H10D 30/6735; H10D 30/6757; H10D 62/121; H10D 64/021; H10D 30/0193; H10D 30/502; H10D 30/797; H10D 64/017; H10D 62/822; H10D 64/685; H10D 30/024; H10D 30/62; H10D 64/025; H10D 64/671; H01L 21/3115
See application file for complete search history.

(56) References Cited

U.S. PATENT DOCUMENTS

| | | | |
|---|---|---|---|
| 11,081,584 B2 | 8/2021 | Savant et al. | |
| 11,355,615 B2* | 6/2022 | Min | ................. H01L 21/76224 |
| 11,688,797 B2 | 6/2023 | Lee et al. | |

(Continued)

*Primary Examiner* — Karen Kusumakar
(74) *Attorney, Agent, or Firm* — NZ Carr Law Office

(57) ABSTRACT

A semiconductor device structure and methods of forming the same are described. The structure includes a gate dielectric layer disposed over a substrate, a gate electrode layer disposed over the gate dielectric layer, and a first gate spacer disposed adjacent the gate dielectric layer. The first gate spacer includes an inner surface facing the gate dielectric layer and an outer surface opposite the inner surface, and the first gate spacer includes a fluorine concentration that decreases from the inner surface and the outer surface towards a center of the first gate spacer. The structure further includes a second gate spacer disposed on the outer surface of the first gate spacer, and the second gate spacer includes a fluorine concentration that decreases from an outer surface towards an inner surface.

20 Claims, 24 Drawing Sheets

(56) References Cited

U.S. PATENT DOCUMENTS

| | | |
|---|---|---|
| 11,996,453 B2 | 5/2024 | Hsieh et al. |
| 2019/0006242 A1* | 1/2019 | Wang ................. H10D 84/0193 |
| 2020/0044087 A1 | 2/2020 | Guha et al. |
| 2020/0135887 A1* | 4/2020 | Wu ...................... H10D 84/038 |
| 2021/0036127 A1 | 2/2021 | Lin et al. |
| 2022/0351976 A1 | 11/2022 | Lee et al. |
| 2022/0367670 A1 | 11/2022 | Lai et al. |
| 2023/0207395 A1 | 6/2023 | Weng et al. |

* cited by examiner

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates fluorination of a first gate spacer of the semiconductor device structure, in accordance with some embodiments.

FIG. 21 illustrates fluorination of a dielectric spacer of the semiconductor device structure, in accordance with some embodiments.

DETAILED DESCRIPTION

Figure 1:
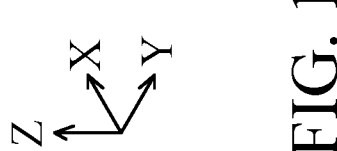
FIGS. 1-5 are perspective views of various stages of manufacturing a semiconductor device structure, in accordance with some embodiments.
Figure 1:
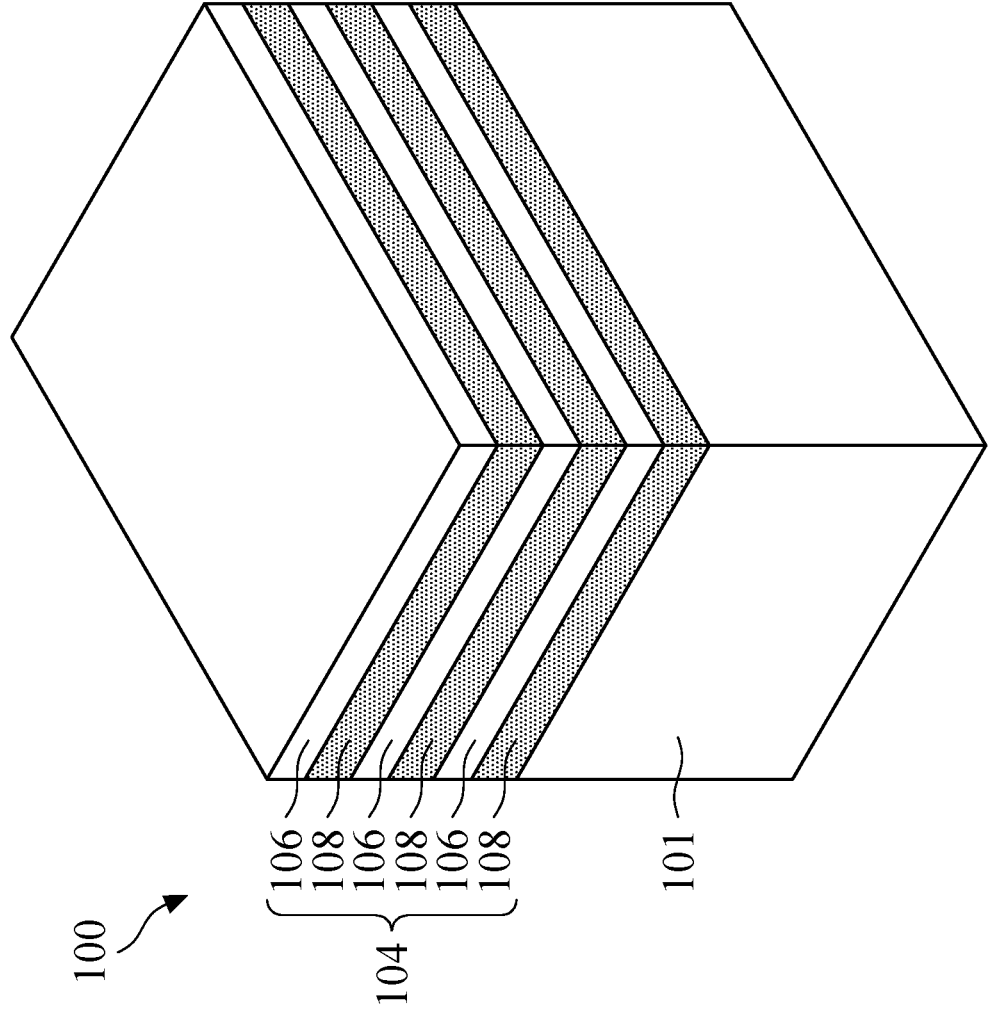

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide semiconductor device structures having fluorinated first and second gate spacers and fluorinated dielectric spacers. The first and second gate spacers and the fluorinated dielectric spacers are fluorinated at different stages of manufacturing the semiconductor device structure. As a result, dielectric constant (K) is reduced, leakage current is reduced, thermal stability is improved, and moisture absorption is reduced.

While the embodiments of this disclosure are discussed with respect to nanostructure channel FETs, such as gate all around (GAA) FETs, for example Horizontal Gate All Around (HGAA) FETs or Vertical Gate All Around (VGAA) FETs, implementations of some aspects of the present disclosure may be used in other processes and/or in other devices, such as planar FETs, Fin-FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-17 show exemplary processes for manufacturing a semiconductor device structure 100 according to embodiments of the present disclosure. It is understood that additional operations can be provided before, during, and after processes shown by FIGS. 1-17, and some of the operations described below can be replaced or eliminated, for additional embodiments of the method. The order of the operations/processes is not limiting and may be interchangeable.

FIGS. 1-5 are perspective views of various stages of manufacturing a semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
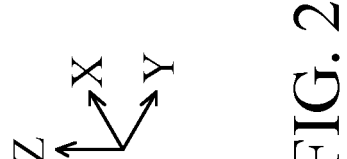
Figure 2:
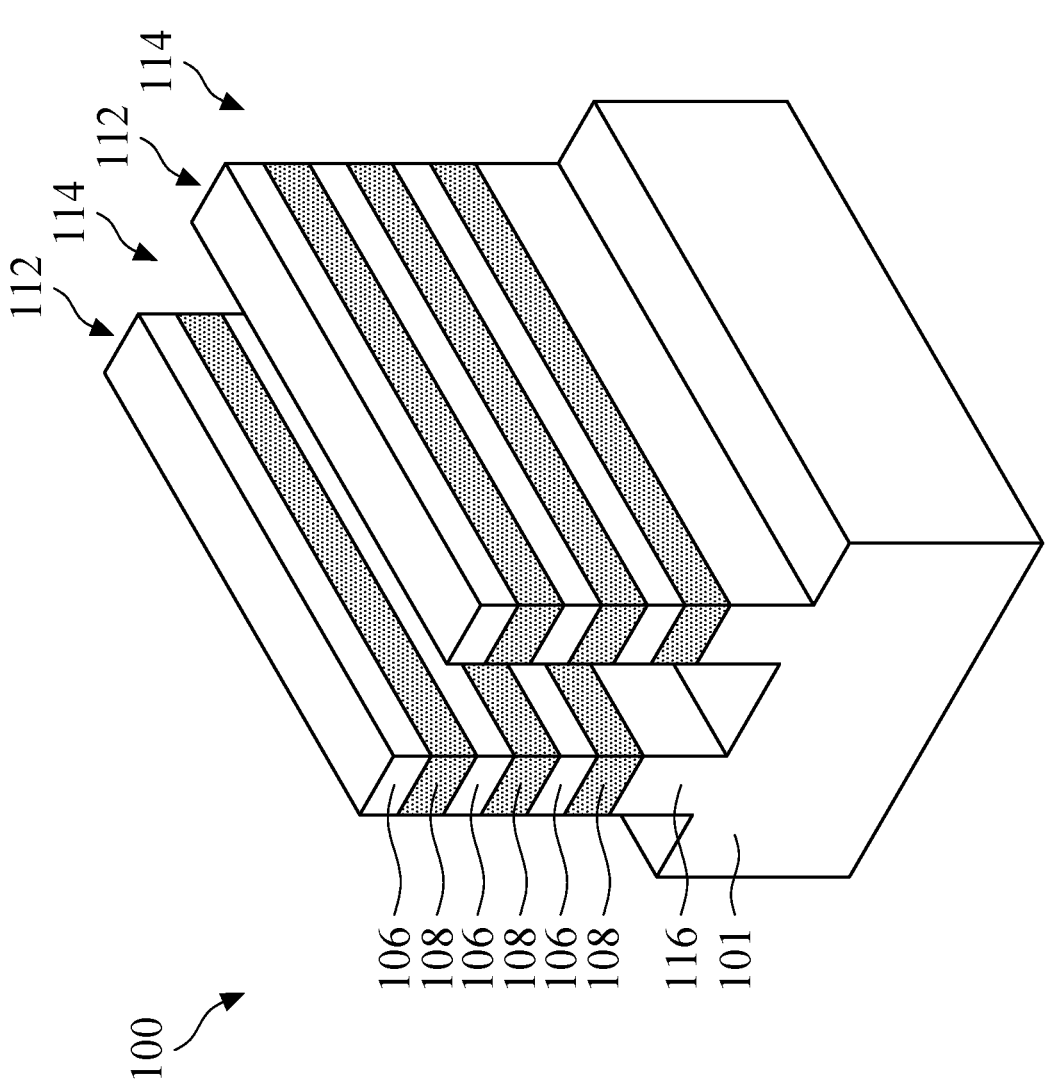

As shown in FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
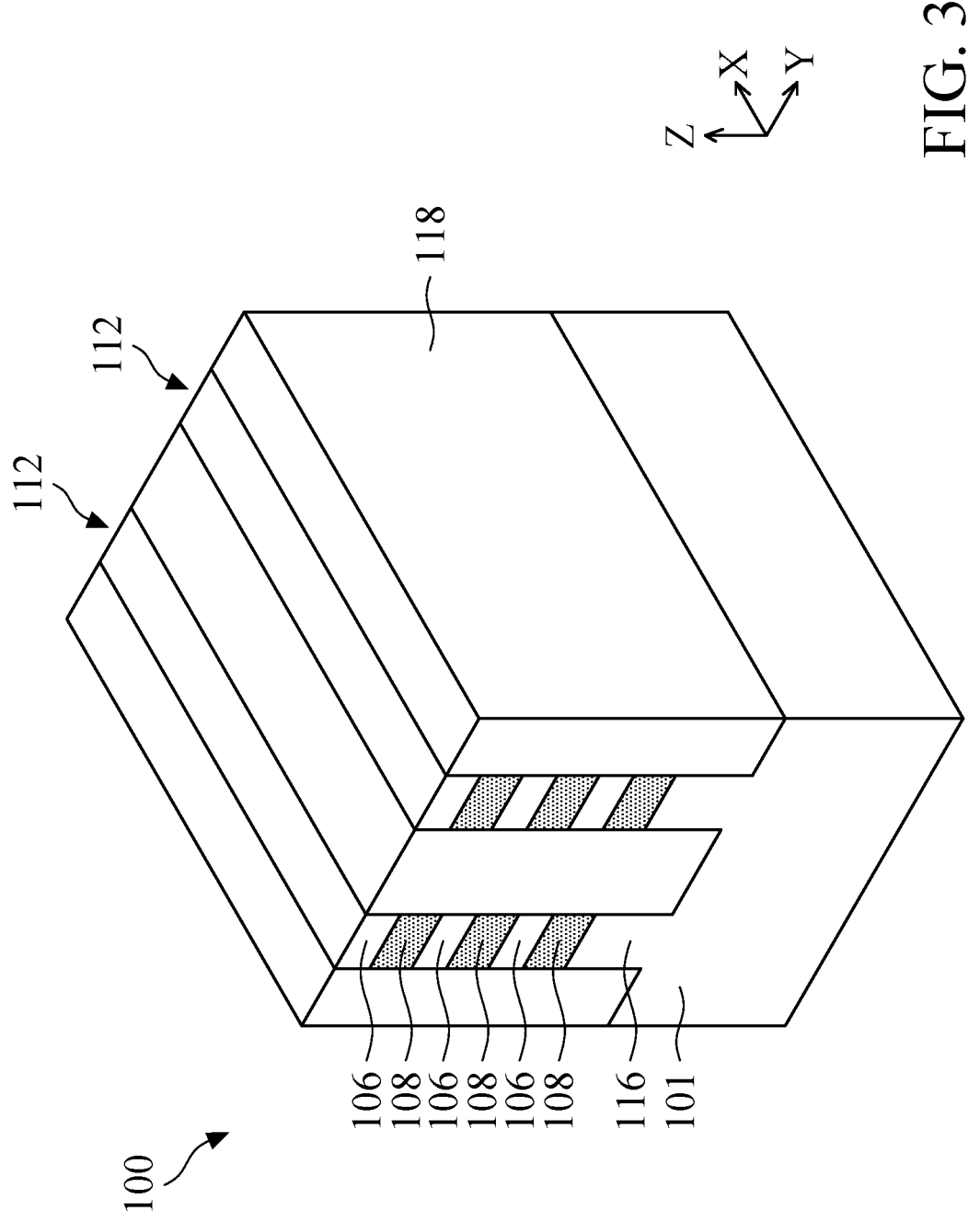

As shown in FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
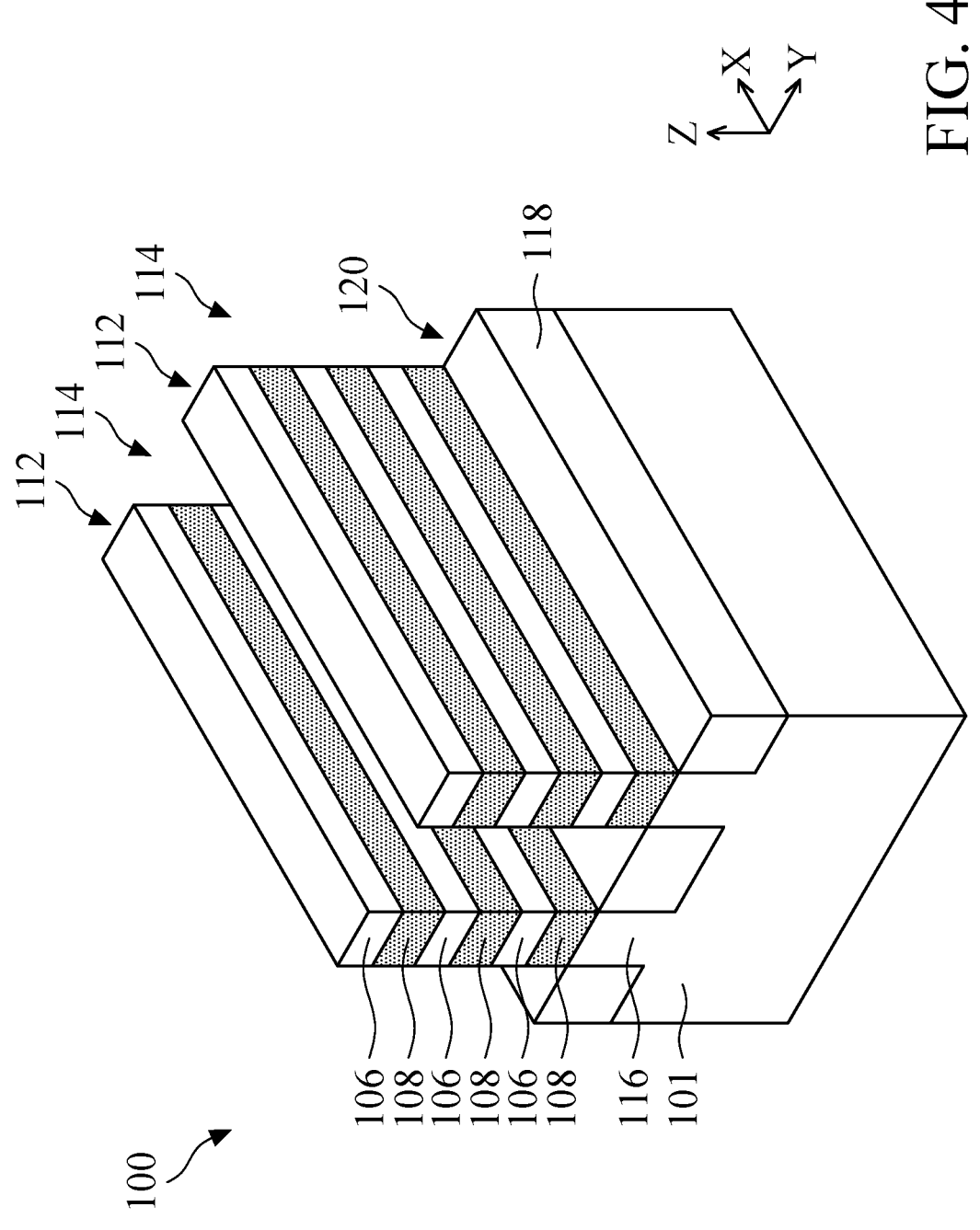

As shown in FIG. 4, the insulating material 118 is recessed to form isolation regions 120. The recess of the insulating material 118 exposes portions of the fin structures 112, such as the stack of semiconductor layers 104. The recess of the insulating material 118 reveals the trenches 114 between the neighboring fin structures 112. The isolation regions 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
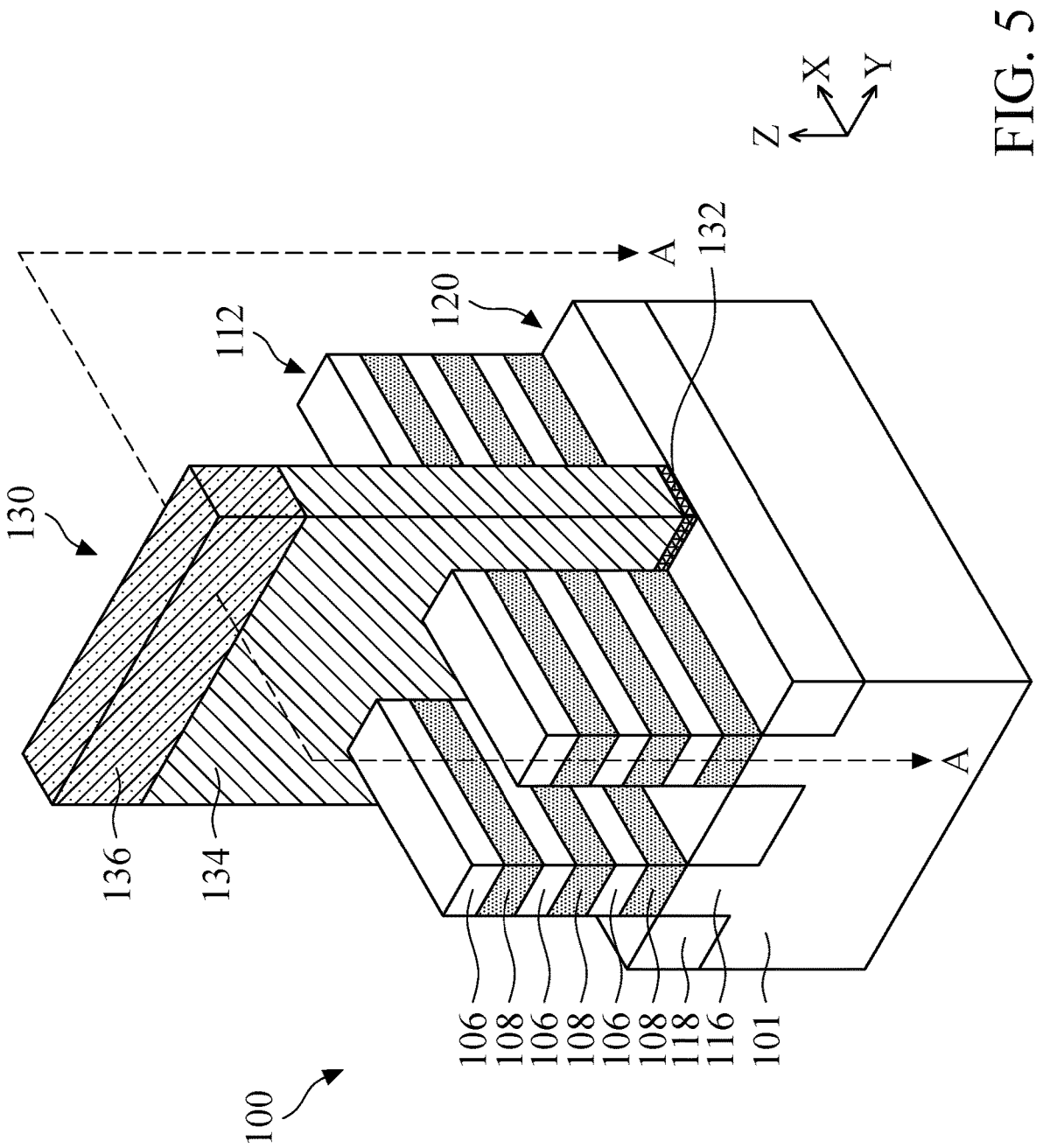

As shown in FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The portions of the fin structures 112 that are covered by the sacrificial gate electrode layer 134 of the sacrificial gate structure 130 serve as channel regions for the semiconductor device structure 100.

Figure 6:
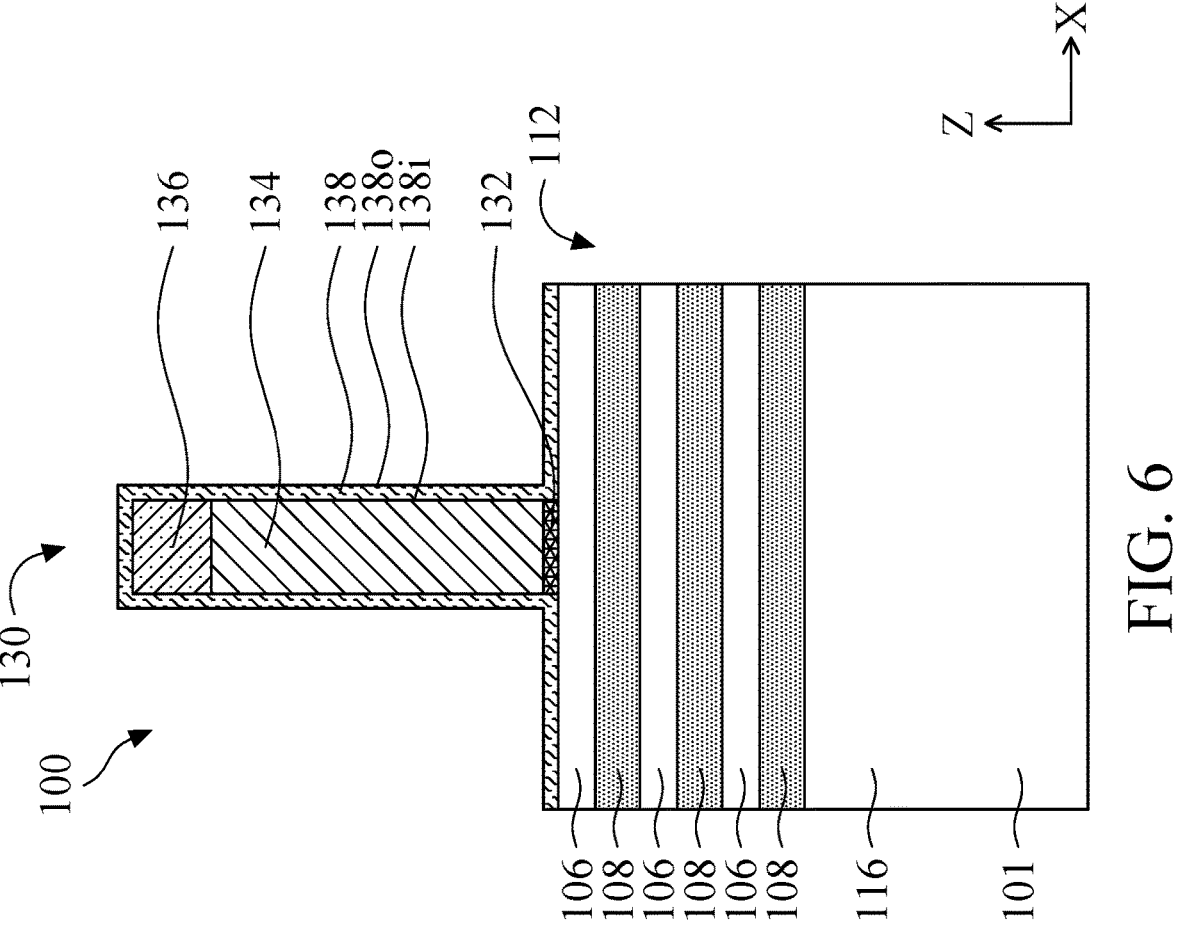
FIG. 6 is a cross-sectional side view of one of various stages of manufacturing the semiconductor device structure taken along line A-A of FIG. 5, in accordance with some embodiments.

FIG. 6 is a cross-sectional side view of one of various stages of manufacturing the semiconductor device structure 100 taken along line A-A of FIG. 5, in accordance with some embodiments. As shown in FIG. 6, a first gate spacer 138 is deposited on the exposed surfaces of the semiconductor device structure 100. For example, the first gate spacer 138 is deposited on the fin structures 112, the isolation regions 120, and the sacrificial gate structure 130. The first gate spacer 138 may be made of a dielectric material such as silicon oxide, silicon nitride, silicon carbide, silicon oxynitride, SiCN, silicon oxycarbide, SiCON, and/or combinations thereof. The first gate spacer 138 may be formed by any suitable process. In some embodiments, the first gate spacer 138 is a conformal layer formed by a conformal process, such as an atomic layer deposition (ALD) process.

Figure 7:
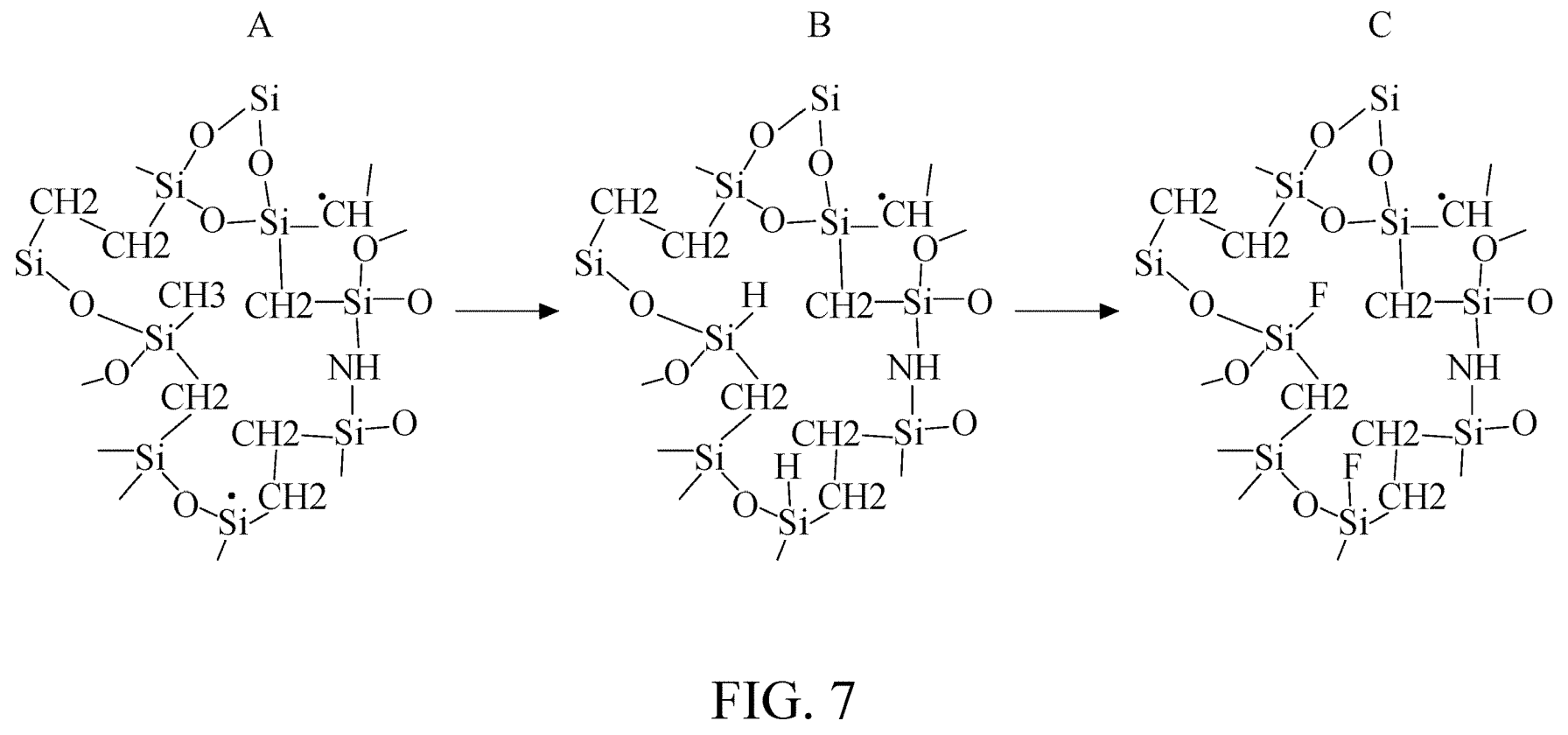

After depositing the first gate spacer 138, one or more processes are performed to incorporate fluorine into the first gate spacer 138. FIG. 7 illustrates fluorination of the first gate spacer 138 of the semiconductor device structure 100, in accordance with some embodiments. In some embodiments, the as-deposited first gate spacer 138 includes SiOCN and may have a chemical structure A as shown in FIG. 7. In some embodiments, a plasma treatment process may be performed on the as-deposited first gate spacer 138, and the chemical structure of the first gate spacer 138 changes from chemical structure A to chemical structure B, as shown in FIG. 7. The plasma treatment process includes exposing the first gate spacer 138 to a hydrogen-containing plasma. The hydrogen-containing plasma may be formed by activating a hydrogen-containing gas by a low power plasma source or a remote plasma source. The hydrogen-containing gas may be any suitable hydrogen-containing gas. In some embodiments, the hydrogen-containing gas is hydrogen gas ($H_2$). In some embodiments, the low power plasma source is a capacitively coupled plasma source, and the plasma power ranges from about 10 W to about 250 W. The plasma generated by the capacitively coupled plasma source or the remote plasma source includes more hydrogen radicals than ions. In addition, the processing temperature of the plasma treatment process is relatively low, such as from about 20 degrees Celsius to about 100 degrees Celsius. As a result, the hydrogen radicals replace the methyl terminal groups or are attached to the dangling Si bonds to form SiH bonds, as shown in the chemical structure B in FIG. 7.

Next, a fluorination process is performed on the treated first gate spacer 138. The fluorination process may be any suitable fluorination process. In some embodiments, the fluorination process is a fluorine soak process. The fluorine soak process may include exposing the treated first gate spacer 138 to a fluorine-containing precursor at a processing temperature less than about 100 degrees Celsius. In some embodiments, the fluorine-containing precursor includes HF, $CF_4$, $F_2$, $C_2F_6$, a combination of HF and $F_2$, or other suitable fluorine-containing precursor. The processing temperature may range from about 20 degrees Celsius to about 99 degrees Celsius, and a processing pressure may range from about 0.1 torr to about 10 torr. The treated first gate spacer 138 may be exposed to the fluorine-containing precursor for a duration ranging from about 1 min to about 30 mins. In some embodiments, the fluorine-containing precursor is $F_2$, and the treated first gate spacer 138 may be exposed to the $F_2$ for a duration ranging from about 5 min to about 5 hours. The fluorine in the fluorine-containing precursor is more likely to break the SiH bonds than SiO bonds under the above mentioned process conditions. As a result, the chemical structure of the first gate spacer 138 changes from the chemical structure B to a chemical structure C shown in FIG. 7. The hydrogen atoms attached to Si are replaced with fluorine atoms. Because of more SiH bonds generated by the plasma treatment process, the fluorination process may be performed with relatively low energy, such as at a low temperature without plasma. Low energy fluorination process may avoid causing the fluorine-containing precursor to become an etchant.

In some embodiments, the plasma treatment process is not performed, and the fluorination process is performed with higher energy, such as at a higher temperature, for example greater than about 200 degrees Celsius. The $SiCH_3$ bonds and/or SiO bonds may be broken by the fluorination process, and the $CH_3$ and/or O are replaced with F to form SiF bonds. In some embodiments, the SiF bonds formed from SiH are more thermally stable than the SiF bonds formed from $SiCH_3$ or SiO. One reason is that the Si in the SiF bond formed from SiH may be also bonded to two or more oxygen atoms, as shown in FIG. 7, while the Si in the SiF bond formed from $SiCH_3$ or SiO may be also bonded to one oxygen atom and/or one or more methyl groups. The two or more oxygen atoms bonded to the Si of the SiF bond formed from SiH may lead to more stable SiF bond. For example, when exposed to a temperature greater than or equal to 600 degrees, the SiF bonds formed from $SiCH_3$ or SiO may decompose, while the SiF bonds formed from SiH may be still stable. In some embodiments, the SiF bonds formed from SiH is stable when exposed to a temperature greater than about 750 degrees Celsius for a duration ranging from about 30 minutes to about 12 hours.

After the fluorination process, the first gate spacer 138 may include about one atomic percent to about five atomic percent of fluorine. As shown in FIG. 6, the first gate spacer 138 has an outer surface 138o and an inner surface 138i. The concentration of fluorine decreases from the outer surface 138o to the inner surface 138i, because the outer surface 138o is exposed to the fluorine-containing precursors. The K value of the first gate spacer 138 may have decreased by about 0.1 to about 0.5. The density of the first gate spacer 138 may range from about 2 g/cm$^3$ to about 3.2 g/cm$^3$. In some embodiments, the first gate spacer 138 may include about five atomic percent to about 20 atomic percent of carbon, and about zero atomic percent to about 10 atomic percent of nitrogen. In some embodiments, the as-deposited first gate spacer 138 has a surface charge average Vcpd ranging from about 0.245 V to about 0.351 V. The fluorinated first gate spacer 138 has a surface charge average Vcpd ranging from −0.083 to about 0.127. Thus, the fluorinated first gate spacer 138 may have a negative surface charge.

Figure 8:
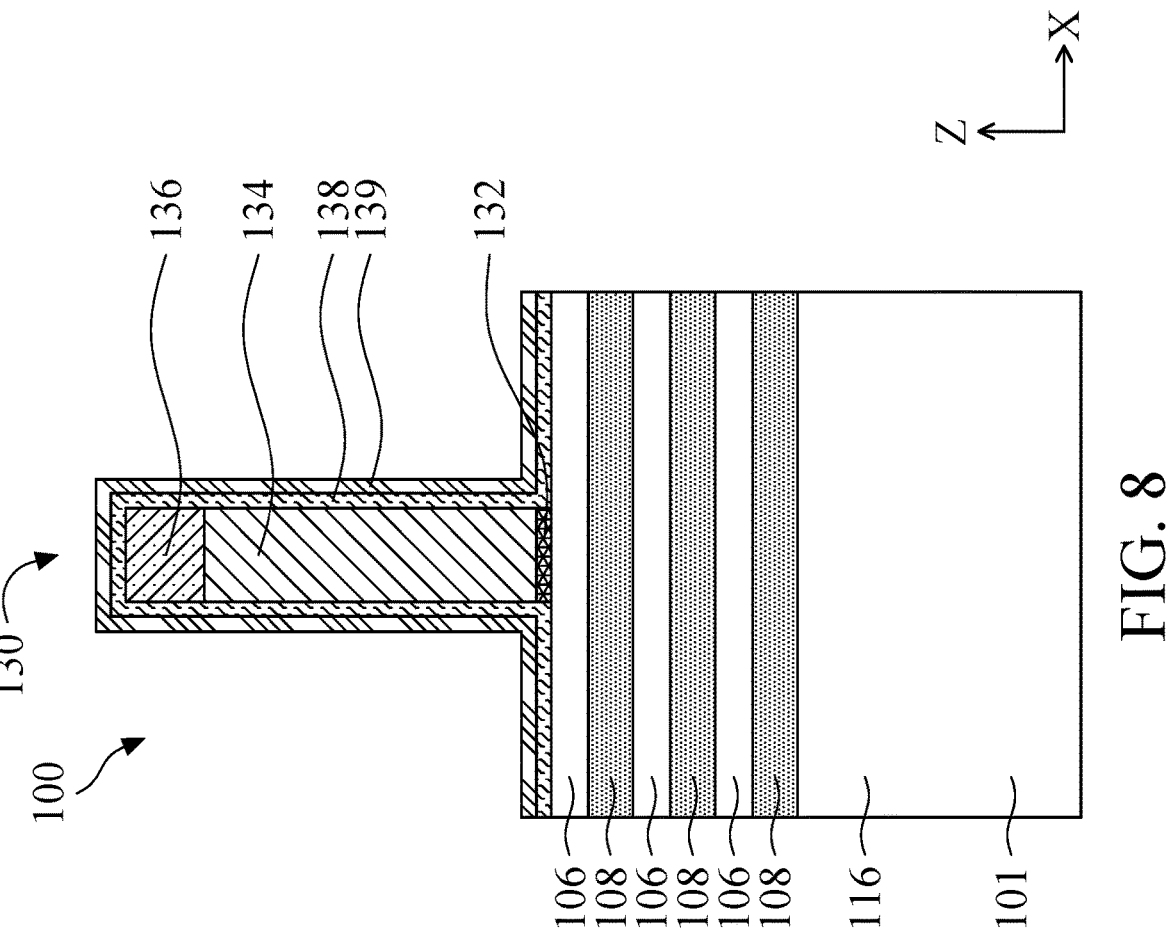
FIGS. 8-10 are cross-sectional side views of various stages of manufacturing the semiconductor device structure taken along line A-A of FIG. 5, in accordance with some embodiments.
Figure 9:
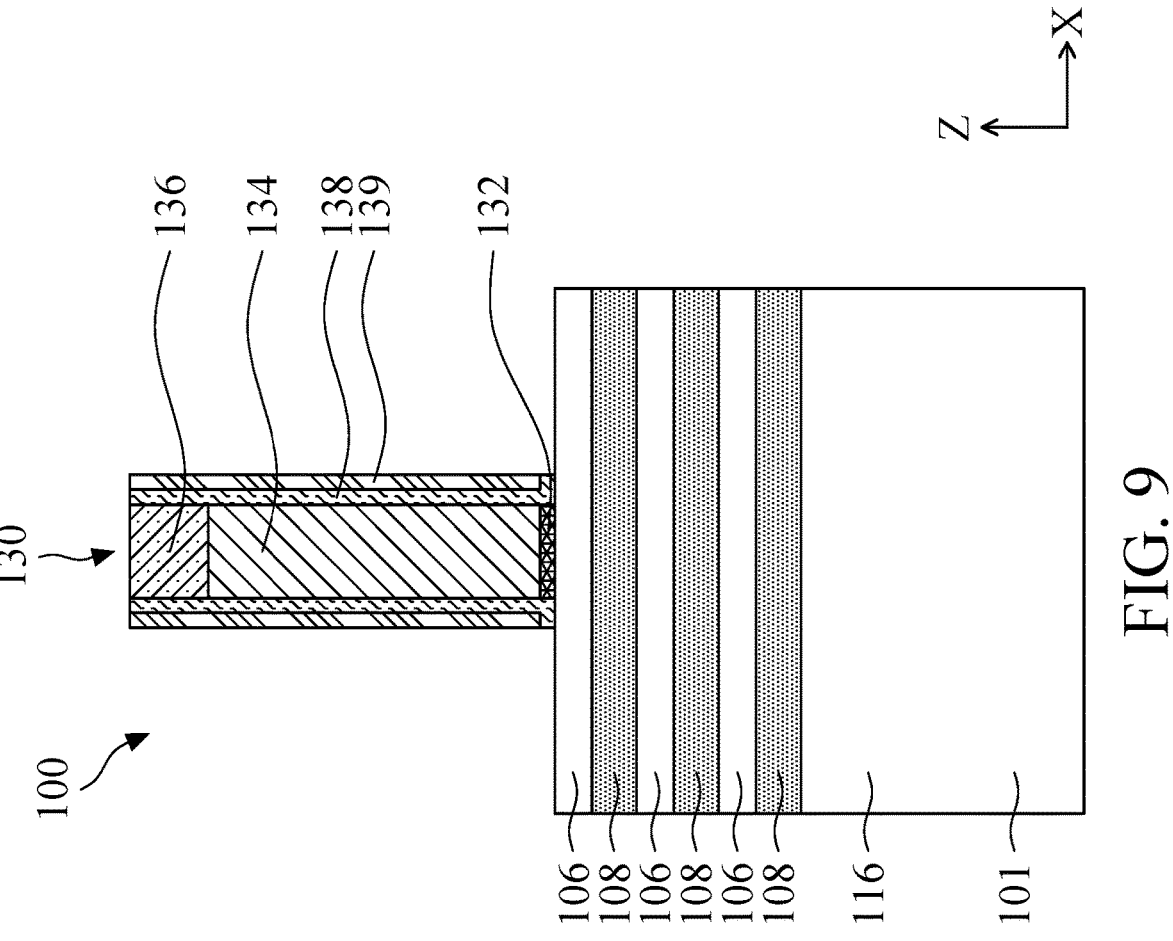
Figure 10:
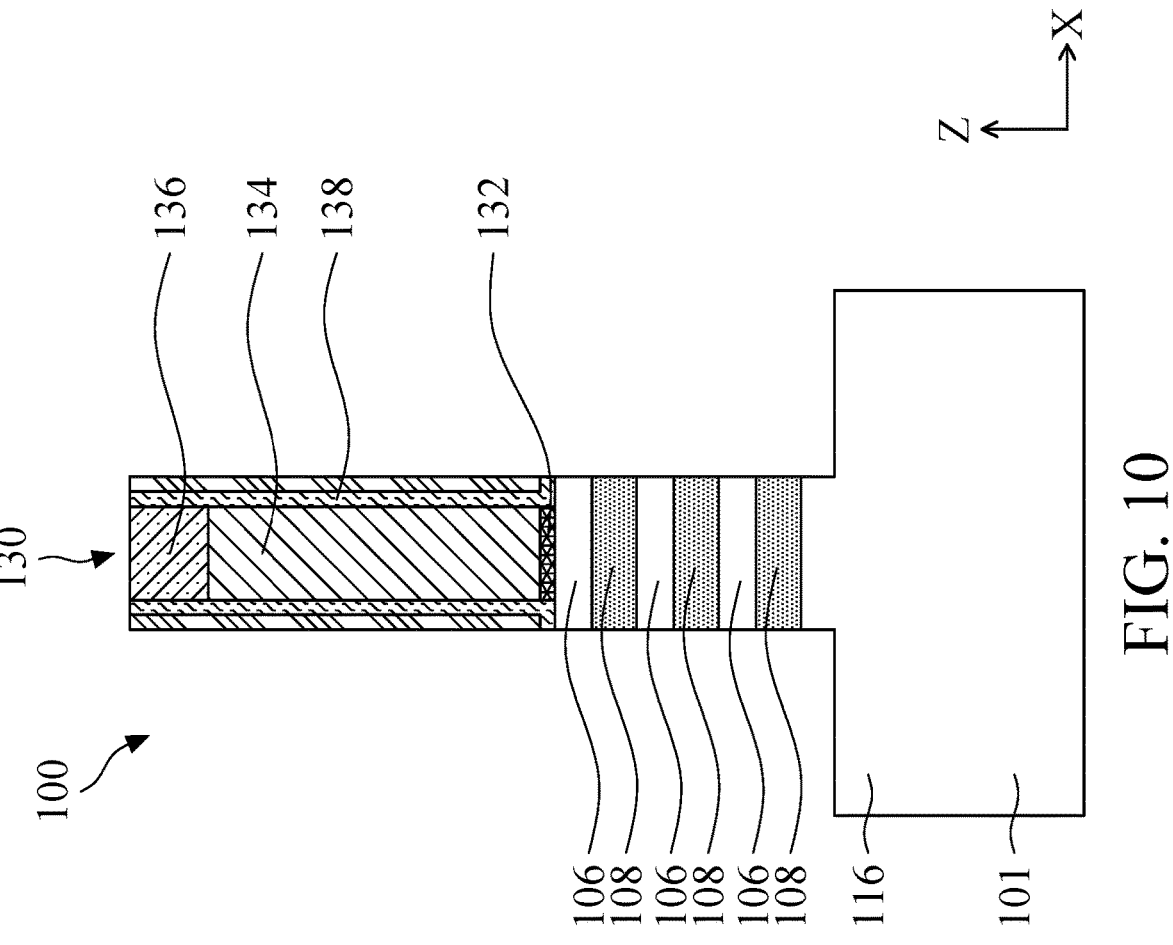

FIGS. 8-10 are cross-sectional side views of various stages of manufacturing the semiconductor device structure 100 taken along line A-A of FIG. 5, in accordance with some embodiments. As shown in FIG. 8, a second gate spacer 139 is deposited on the first gate spacer 138. The second gate spacer 139 may include any suitable dielectric material, such as SiO$_x$, SiON, SiN, SiCON, or SiCO. The second gate spacer 139 may have a thickness ranging from about 0.5 nm to about 5 nm. The second gate spacer 139 may also function as a capping layer for the fluorinated first gate spacer 138. Subsequent processes, such as etching or epitaxial growth processes may cause the fluorine in the first gate spacer 138 to be released, which may damage the exposed surfaces of the semiconductor device structure 100. The second gate spacer 139 may be formed by any suitable process. In some embodiments, the second gate spacer 139 is deposited by CVD, PECVD, or electron cyclotron resonance CVD (ECR-CVD). The plasma source may be inductively coupled plasma source or capacitively coupled plasmas source. The plasma power may range from about 100 W to about 500 W, and the processing temperature may range from about 100 degrees Celsius to about 600 degrees Celsius. In some embodiments, a layer is deposited, and a treatment process is performed to form the second gate spacer 139. For example, the layer, such as an amorphous silicon layer, a silicon carbide layer, a SiCN layer, or a SiCON layer, is first deposited on the first gate spacer 138, and the layer is then exposed to a treatment gas to form the second gate spacer 139. The treatment gas may be an oxygen-containing gas, a nitrogen-containing gas, or a combination thereof. In some embodiments, the treatment gas includes N$_2$O, NH$_3$, O$_2$, or a combination of N$_2$ and O$_2$.

At this stage, the second gate spacer 139 is not fluorinated. If the second gate spacer 139 is fluorinated immediately after being deposited, subsequent processes, such as etching or epitaxial growth processes may cause the fluorine in the second gate spacer 139 to be released.

As shown in FIG. 9, horizontal portions of the first and second gate spacers 138, 139 are removed. In some embodiments, the horizontal portions of the first and second gate spacers 138, 139 are removed by an anisotropic etch process. The anisotropic etch process may be a selective etch process that does not substantially affect the mask layer 136, the stack of semiconductor layers 104, and the isolation regions 120.

As shown in FIG. 10, the portions of the fin structures 112 not covered by the sacrificial gate structure 130 and the first and second gate spacers 138, 139 are recessed to a level above, at, or below the top surfaces of the isolation regions 120. The recess of the portions of the fin structures 112 can be done by an etch process. The etch process may be a dry etch, such as a RIE, NBE, or the like, or a wet etch, such as using tetramethylammonium hydroxide (TMAH), ammonium hydroxide (NH$_4$OH), or any suitable etchant.

Figure 11:
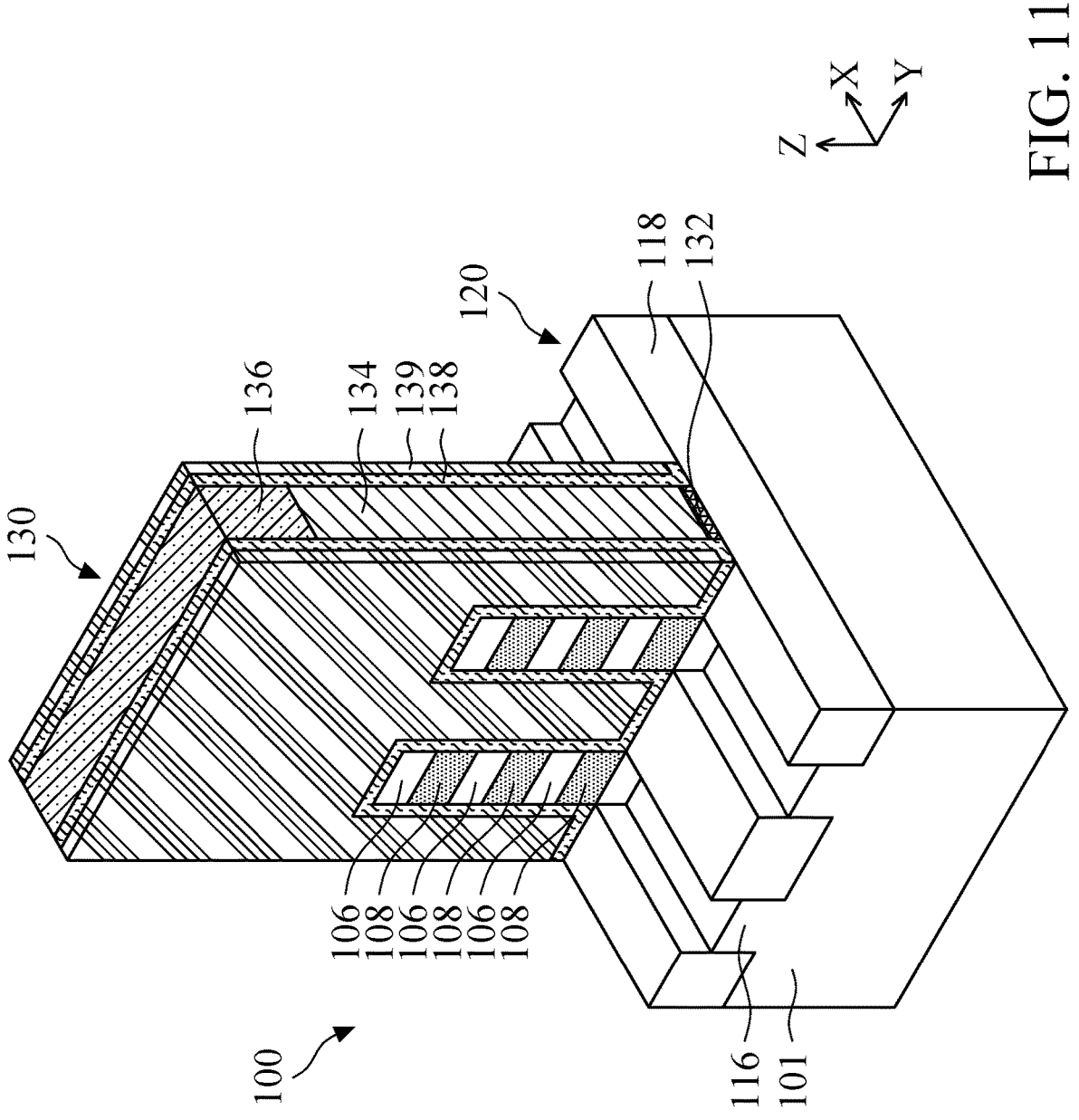
FIG. 11 is a perspective view of the semiconductor device structure of FIG. 10, in accordance with some embodiments.
Figure 12:
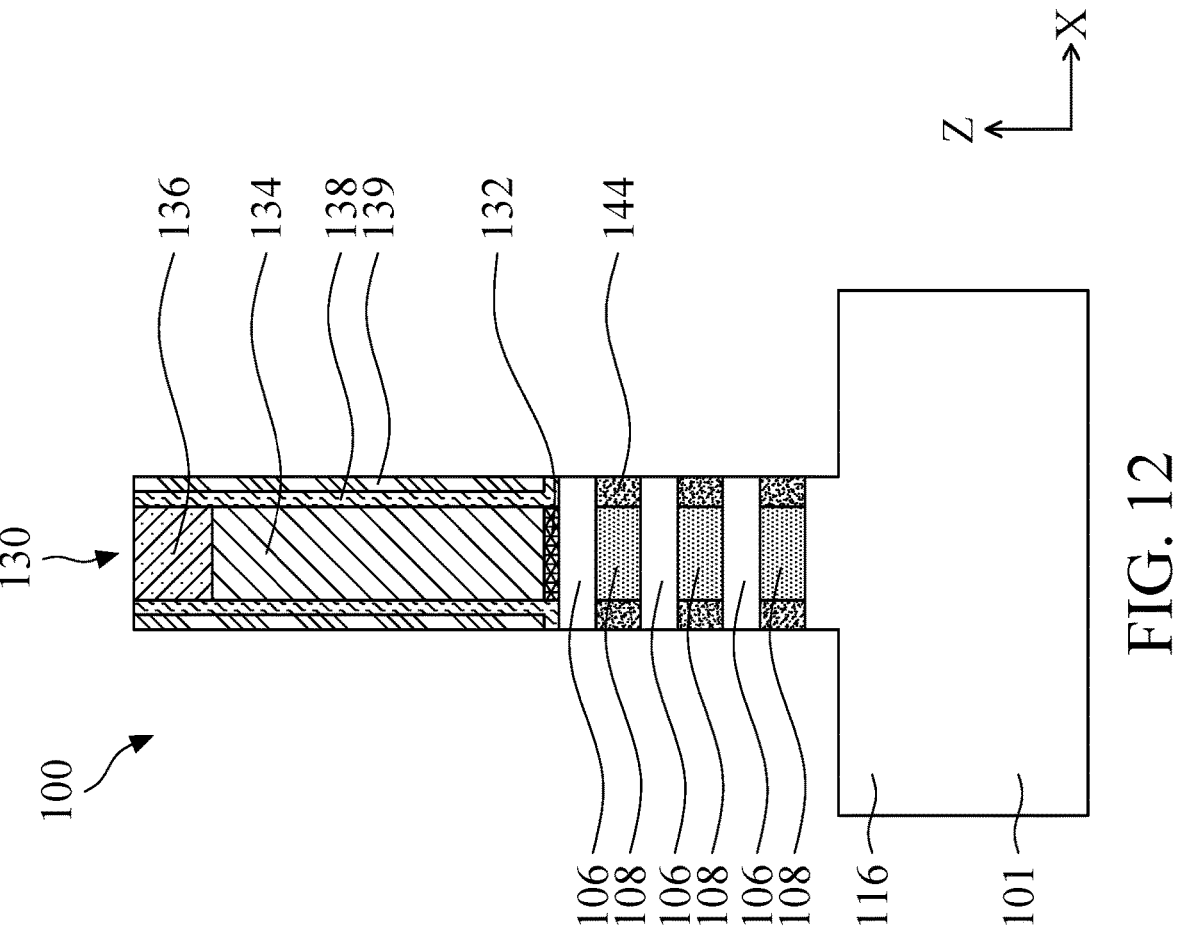
FIGS. 12-17 are cross-sectional side views of various stages of manufacturing the semiconductor device structure taken along line A-A of FIG. 5, in accordance with some embodiments.

FIG. 11 is a perspective view of the semiconductor device structure 100 of FIG. 10, in accordance with some embodiments. FIGS. 12-18 are cross-sectional side views of various stages of manufacturing the semiconductor device structure taken along line A-A of FIG. 5, in accordance with some embodiments. As shown in FIG. 12, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etch process. In cases where the second semiconductor layers 108 are made of SiGe and the first semiconductor layers 106 are made of silicon, the second semiconductor layer 108 can be selectively etched using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figure 13:
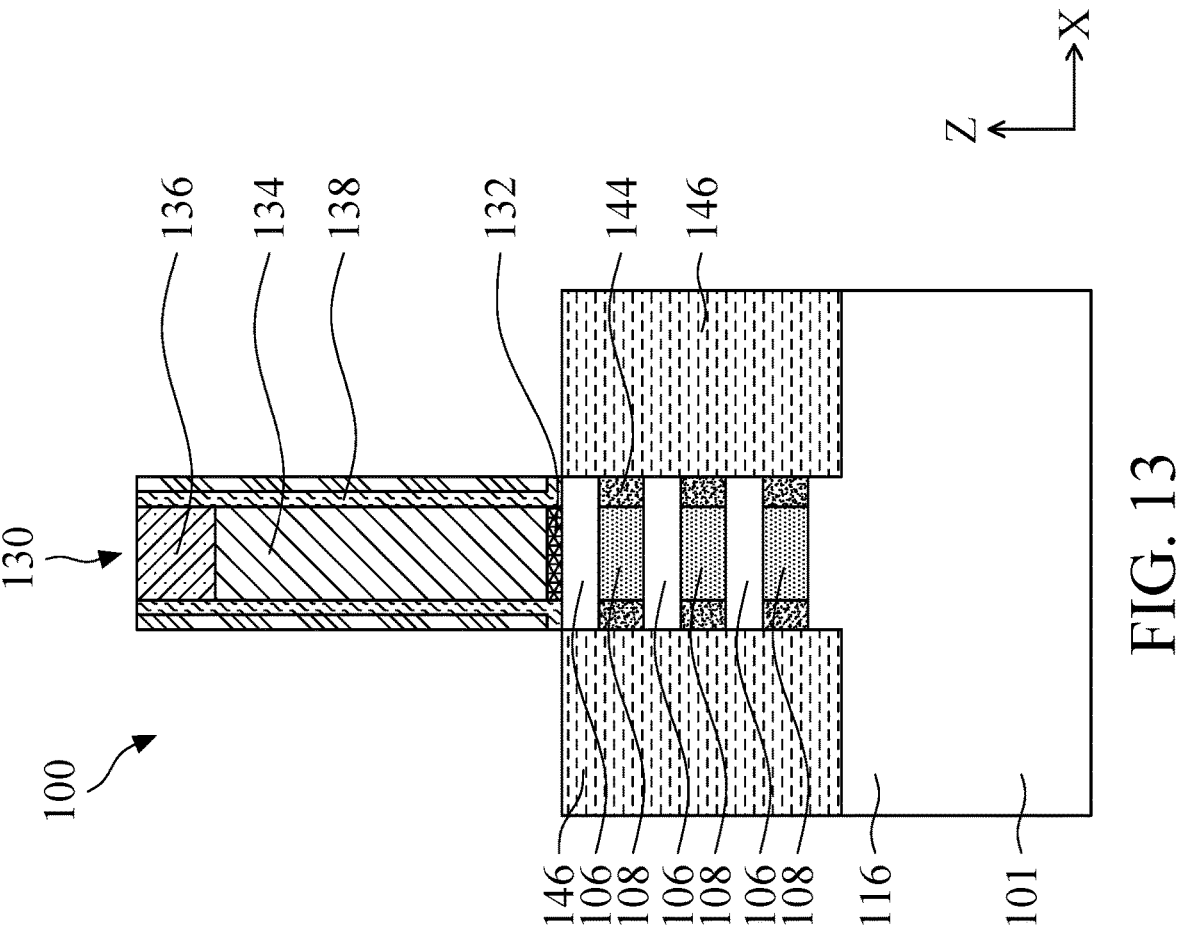

As shown in FIG. 13, source/drain (S/D) regions 146 are formed from the well portion 116. The S/D regions 146 may grow both vertically and horizontally to form facets, which may correspond to crystalline planes of the material used for the well portion 116. In this disclosure, a source region and a drain region are interchangeably used, and the structures thereof are substantially the same. Furthermore, source/drain region(s) may refer to a source or a drain, individually or collectively dependent upon the context. The S/D regions 146 may be made of one or more layers of Si, SiP, SiC and SiCP for n-channel FETs or Si, SiGe, Ge for p-channel FETs. For p-channel FETs, p-type dopants, such as boron (B), may also be included in the S/D regions 146. The S/D regions 146 may be formed by an epitaxial growth method using CVD, ALD or MBE.

Figure 14:
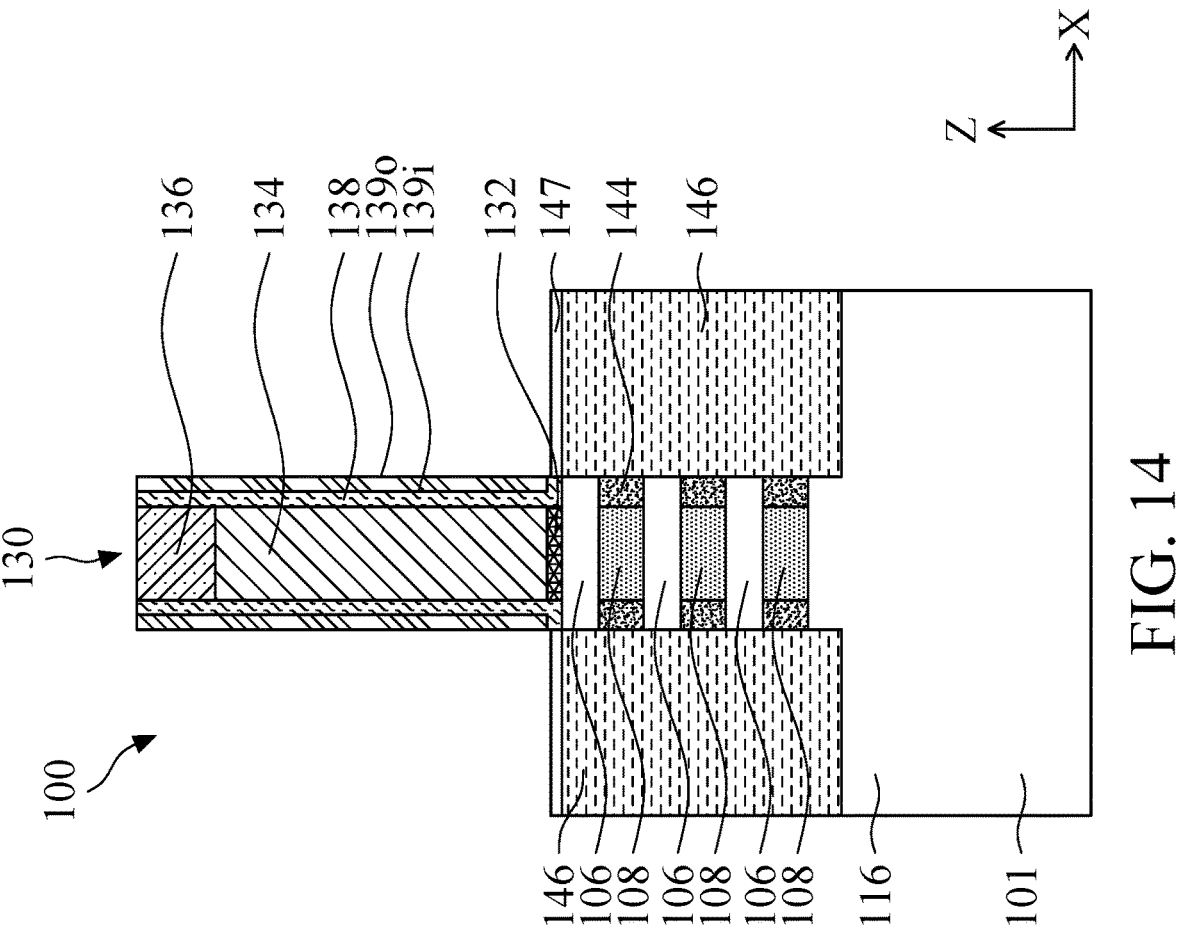

As shown in FIG. 14, exposed portions of the S/D regions 146 are oxidized to form oxide layers 147. The oxide layers 147 may be formed by any suitable process. In some embodiments, the oxide layers 147 are formed as a result of a clean process. The clean process may be performed after the formation of the S/D regions 146. The clean process may use solutions such as HF, high temperature sulfuric peroxide mixture (HTSPM), or ammonia plus hydrogen peroxide. The oxide layer 147 may have a thickness ranging from about 0.5 nm to about 3 nm.

Next, one or more processes are performed to incorporate fluorine into the second gate spacer 139. The one or more processes to incorporate fluorine into the second gate spacer 139 may be the same as or different from the one or more processes to incorporate fluorine into the first gate spacer 138. In some embodiments, the plasma treatment process and the fluorination process described in FIG. 7 are performed to fluorinate the second gate spacer 139. In some embodiments, the fluorination process with higher energy is performed to fluorinate the second gate spacer 139 without the plasma treatment process. In some embodiments, the first gate spacer 138 is fluorinated by the fluorination process with higher energy without the plasma treatment process, and the second gate spacer 139 is fluorinated by the plasma treatment process and the fluorination process described in FIG. 7. The entire semiconductor device structure 100 is covered with the first gate spacer 138 during the fluorination process with higher energy. A small portion of the first gate spacer 138 may be removed by the fluorine during the fluorination process with higher energy, and the other components of the semiconductor device structure 100 are protected by the first gate spacer 138. Components of the semiconductor device structure 100 are exposed during the fluorination of the second gate spacer 139. Thus, the plasma treatment process and the fluorination with low energy are performed to fluorinate the second gate spacer 139 in order to protect other components of the semiconductor device structure 100. In other words, in some embodiments, the first and second gate spacers 138, 139 are fluorinated using different processes in order to protect other components of the semiconductor device structure 100.

As shown in FIG. 14, the second gate spacer 139 has an outer surface 139o and an inner surface 139i. The concentration of fluorine decreases from the outer surface 139o to the inner surface 139i, because the outer surface 139o is exposed to the fluorine-containing precursors. At this stage, both the first and second gate spacers 138, 139 are fluorinated. As a result, the K value of the first and second gate spacers 138, 139 is decreased. Furthermore, leakage current is reduced, thermal stability is improved, and moisture absorption is reduced. In some embodiments, the combined thickness of the first and second gate spacers 138, 139 is less than about 20 nm, such as from about 5 nm to about 18 nm.

After incorporating fluorine into the second gate spacer 139, the oxide layers 147 may be removed. The removal of the oxide layers 147 may be performed by any suitable process. In some embodiments, a selective etching process is performed to remove the oxide layers 147. Because the oxide layers 147 are substantially thin, the selective etching process does not substantially affect the second gate spacer 139 and the S/D regions 146.

Figure 15:
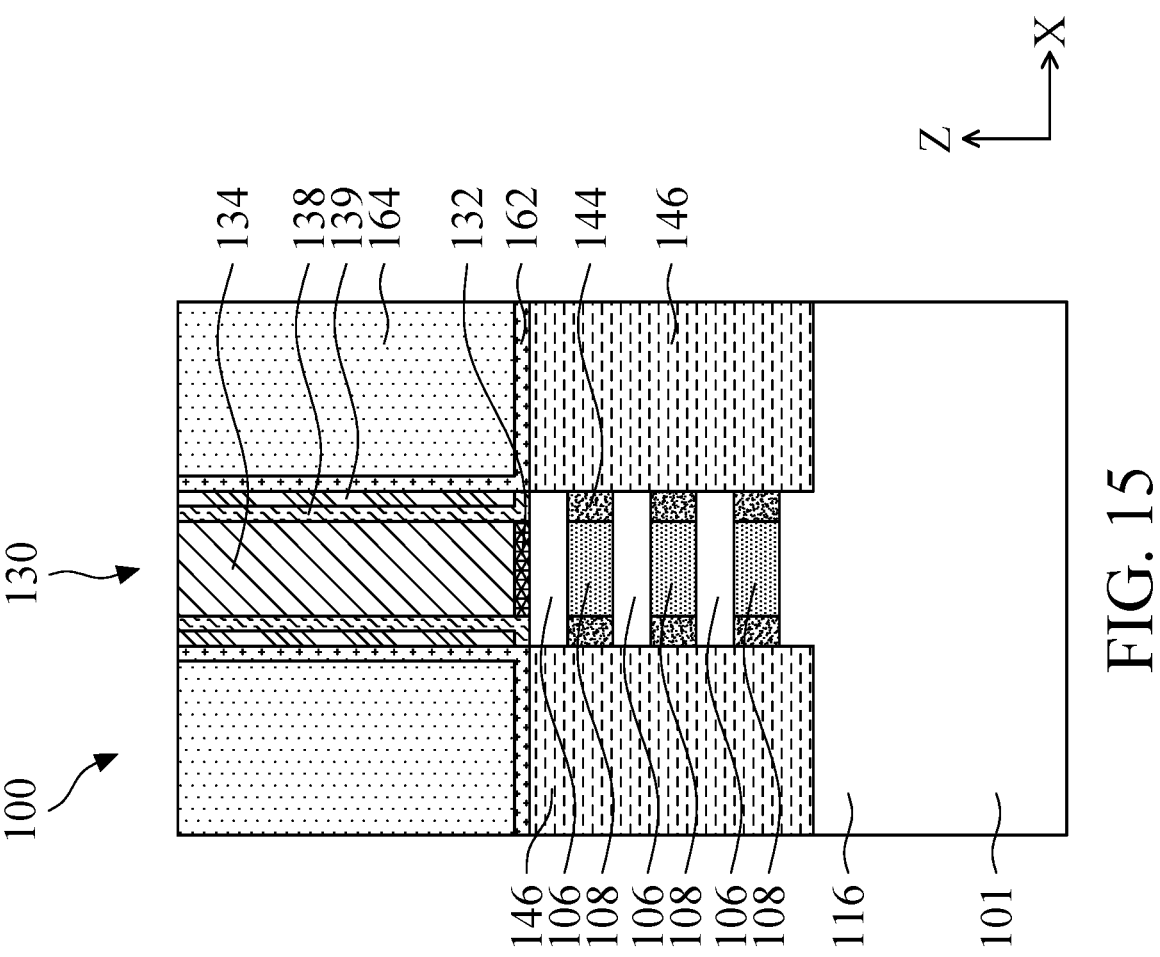

As shown in FIG. 15, a contact etch stop layer (CESL) 162 is conformally formed on the exposed surfaces of the semiconductor device structure 100. The CESL 162 covers the second gate spacer 139, the isolation regions 120, and the S/D regions 146. The CESL 162 may also function as a capping layer for the fluorinated second gate spacer 139. Subsequent processes, such as etching and thermal processes may cause the fluorine in the second gate spacer 139 to be released, which may damage the exposed surfaces of the semiconductor device structure 100. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. In some embodiments, the CESL 162 is a single layer, as shown in FIG. 15. In some embodiments, the CESL 162 includes two or more layers. Next, an interlayer dielectric (ILD) layer 164 is formed on the CESL 162. The materials for the ILD layer 164 may include compounds including Si, O, C, and/or H, such as silicon oxide, SiCOH, or SiOC. Organic materials, such as polymers, may also be used for the ILD layer 164. The ILD layer 164 may be deposited by a PECVD process or other suitable deposition technique. In some embodiments, after formation of the ILD layer 164, the semiconductor device structure 100 may be subject to a thermal process to anneal the ILD layer 164.

After the ILD layer 164 is formed, a planarization operation, such as CMP, is performed on the semiconductor device structure 100 until the sacrificial gate electrode layer 134 is exposed, as shown in FIG. 15.

Figure 16:
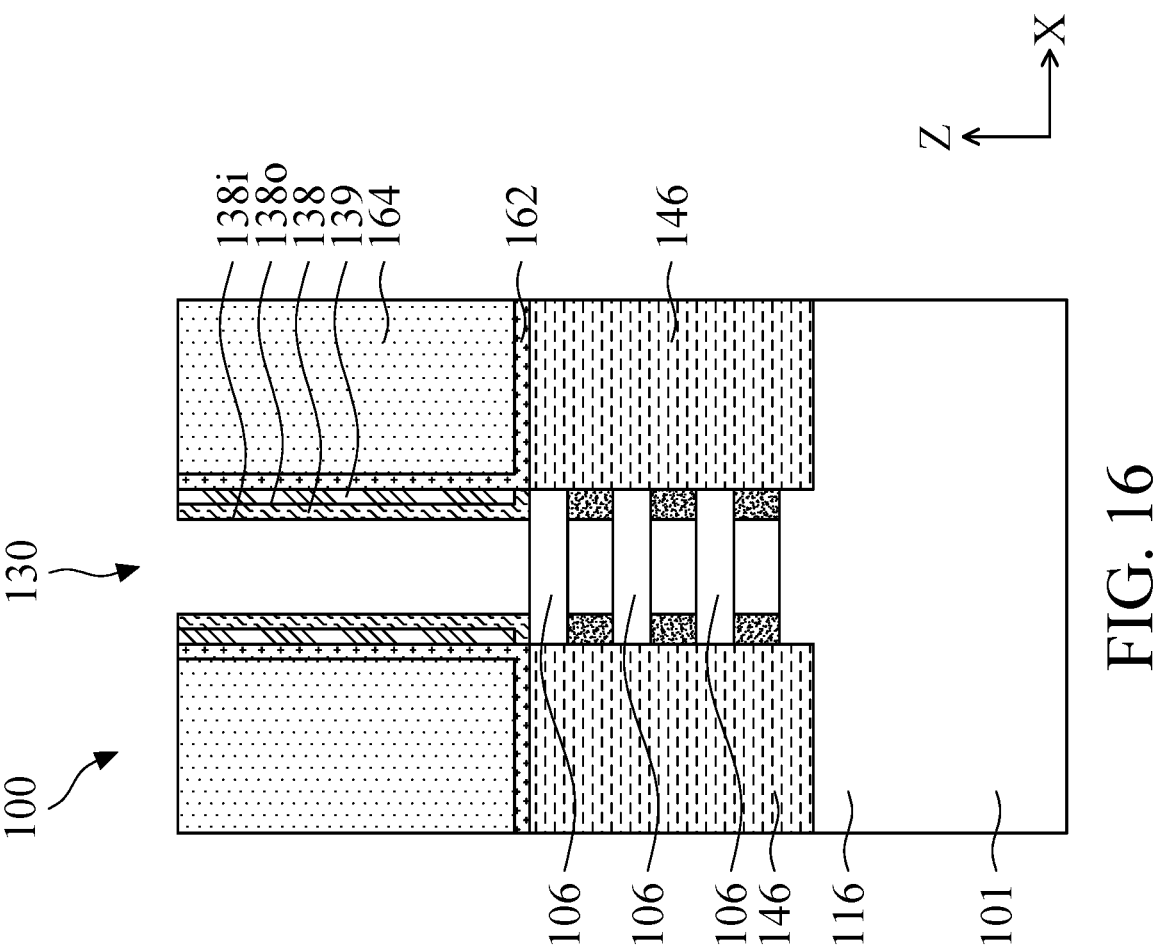

As shown in FIG. 16, the sacrificial gate structure 130 and the second semiconductor layers 108 are removed. The removal of the sacrificial gate structure 130 and the semiconductor layers 108 forms an opening between the first gate spacers 138 and between the first semiconductor layers 106. The ILD layer 164 protects the S/D regions 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the first gate spacers 138, the ILD layer 164, and the CESL 162.

The second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si, the dielectric materials of the first gate spacers 138, and the dielectric spacers 144. In one embodiment, the second semiconductor layers 108 can be removed using a wet etchant such as, but not limited to, hydrofluoric (HF), nitric acid ($HNO_3$), hydrochloric acid (HCl), or phosphoric acid ($H_3PO_4$).

In some embodiments, after the removal of the sacrificial gate structure 130 but before the removal of the second semiconductor layers 108, one or more processes are performed to incorporate additional fluorine into the first gate spacer 138. The one or more processes to incorporate additional fluorine into the first gate spacer 138 may be the same as or different from the one or more processes to incorporate initial fluorine into the first gate spacer 138 or the one or more processes to incorporate fluorine into the second gate spacer 139. In some embodiments, the plasma treatment process and the fluorination process described in FIG. 7 are performed to further fluorinate the first gate spacer 138. In some embodiments, the fluorination process with higher energy is performed to further fluorinate the first gate spacer 138 without the plasma treatment process. In some embodiments, the first gate spacer 138 is initially fluorinated by the fluorination process with higher energy without the plasma treatment process prior to the formation of the second gate spacer 139, the second gate spacer 139 is fluorinated by the plasma treatment process and the fluorination process described in FIG. 7 prior to the formation of the CESL 162, and the first gate spacer 138 is further fluorinated by the plasma treatment process and the fluorination process described in FIG. 7 after the removal of the sacrificial gate structure 130 because the first semiconductor layers 106 are exposed. In other words, in some embodiments, the first gate spacers 138 are fluorinated more than once using different processes in order to protect other components of the semiconductor device structure 100. The first gate spacer 138 is being fluorinated more than once. As a result, the K value of the first gate spacer 138 is further decreased. Furthermore, leakage current is further reduced, thermal stability is further improved, and moisture absorption is further reduced.

Figures 18A, 18B:
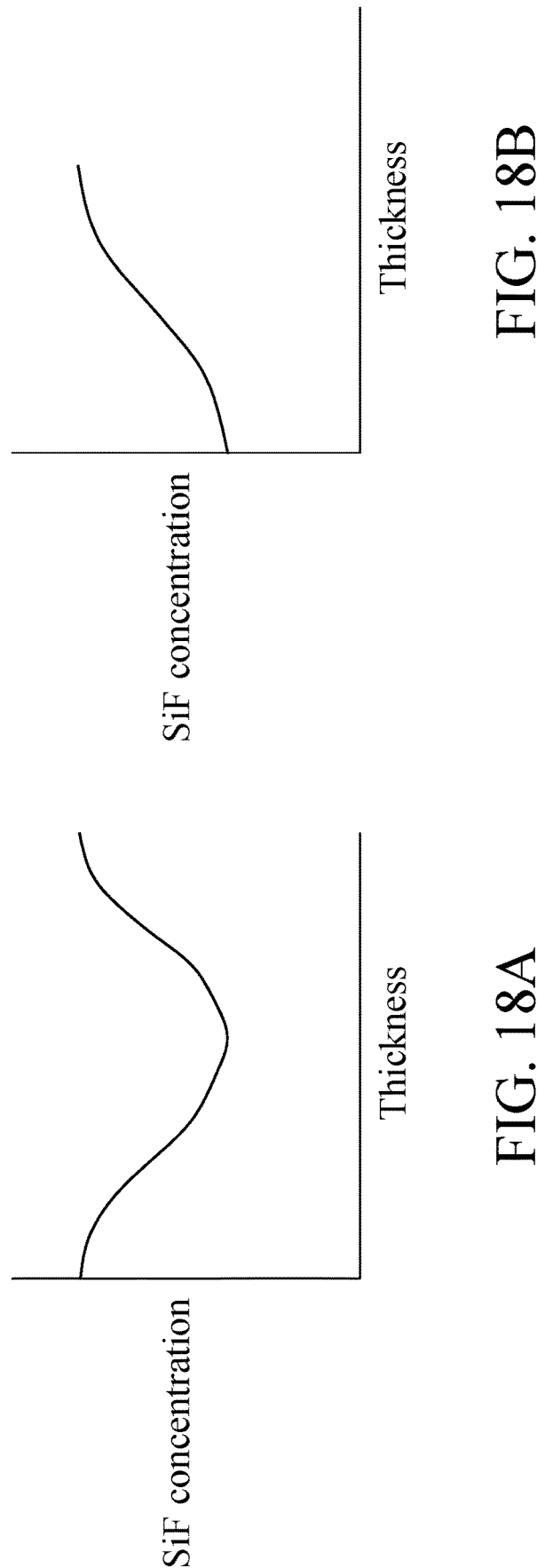
FIGS. 18A and 18B are charts showing SiF concentration profile in the first and a second gate spacers, in accordance with some embodiments.

FIGS. 18A and 18B are charts showing SiF concentration profile in the first and second gate spacers 138, 139, respectively, in accordance with some embodiments. As shown in FIG. 18A, the fluorine concentration (measured in terms of SiF concentration) profile in the first gate spacer 138 is illustrated. The minimum value on the X axis represents the location of the inner surface 138i, and the maximum value on the X axis represents the location of the outer surface 1380. The fluorine concentration is the highest at the inner surface 138i and at the outer surface 1380, and the fluorine concentration gradually decreases towards the center of the first gate spacer 138.

As shown in FIG. 18B, the fluorine concentration (measured in terms of SiF concentration) profile in the second gate spacer 139 is illustrated. The minimum value on the X axis represents the location of the inner surface 139i, and the maximum value on the X axis represents the location of the outer surface 1390. The fluorine concentration is the lowest at the inner surface 139i and is the highest at the outer surface 1390. Thus, the fluorine concentration profiles of the first and second gate spacers 138, 139 are different as a result of the fluorination processes described above.

Figure 17:
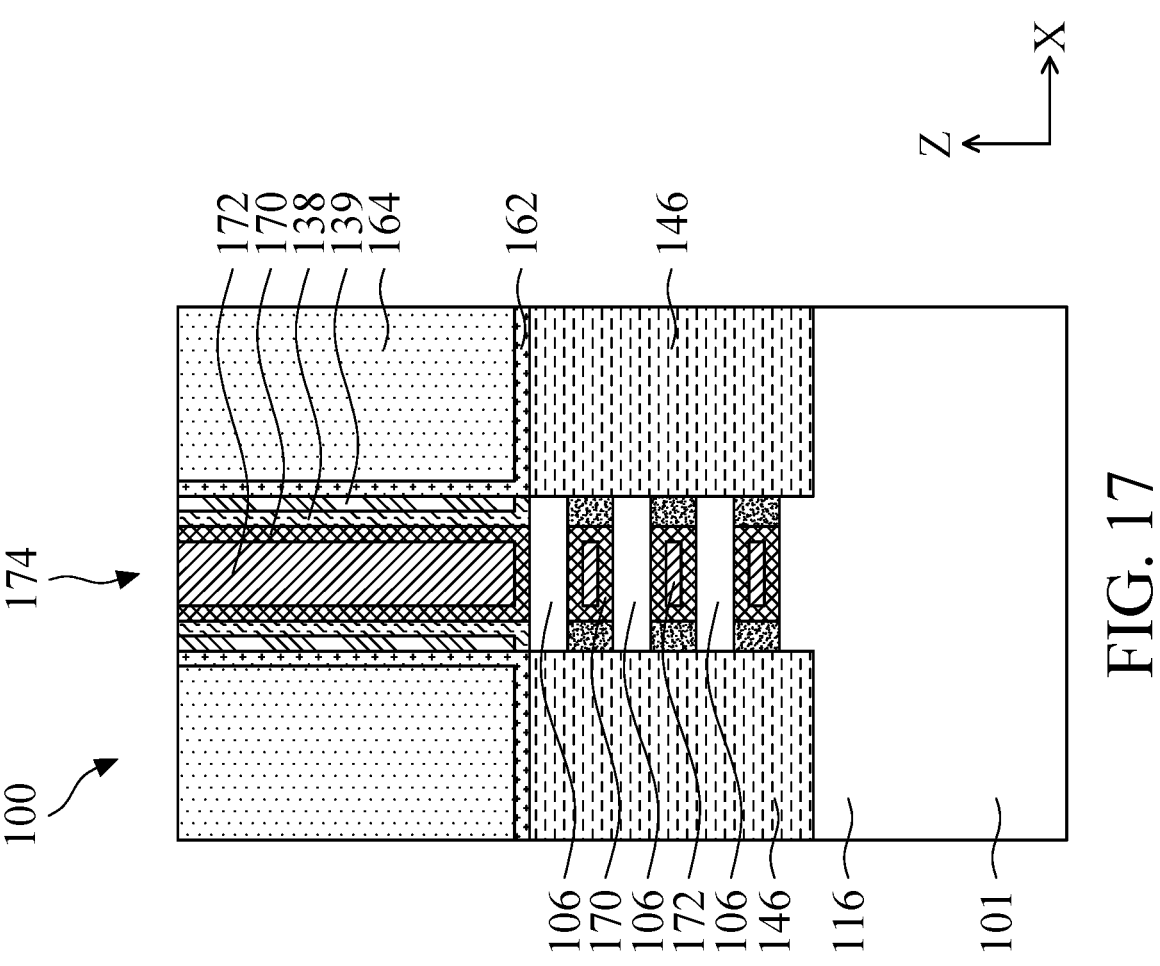

As shown in FIG. 17, after the formation of the nanostructure channels (i.e., the exposed portions of the first semiconductor layers 106), a gate dielectric layer 170 is formed to surround the exposed portions of the first semiconductor layers 106, and a gate electrode layer 172 is formed on the gate dielectric layer 170. The gate dielectric layer 170 and the gate electrode layer 172 may be collectively referred to as a gate structure 174. In some embodiments, an interfacial layer (IL) (not shown) is formed between the gate dielectric layer 170 and the exposed surfaces of the first semiconductor layers 106. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electroplating, or other suitable deposition technique. The gate electrode layer 172 may be also deposited over the upper surface of the ILD layer 164. The gate dielectric layer 170 and the gate electrode layer 172 formed over the ILD layer 164 are then removed by using, for example, CMP, until the top surface of the ILD layer 164 is exposed.

It is understood that the semiconductor device structure 100 may undergo further processes to form conductive contacts in the ILD layer 164 to be electrically connected to the S/D regions 164 and to form conductive contacts to be electrically connected to the gate electrode layer 172. An interconnect structure may be formed over the semiconductor device structure 100 to provide electrical paths to the devices formed on the substrate 101.

Figure 19:
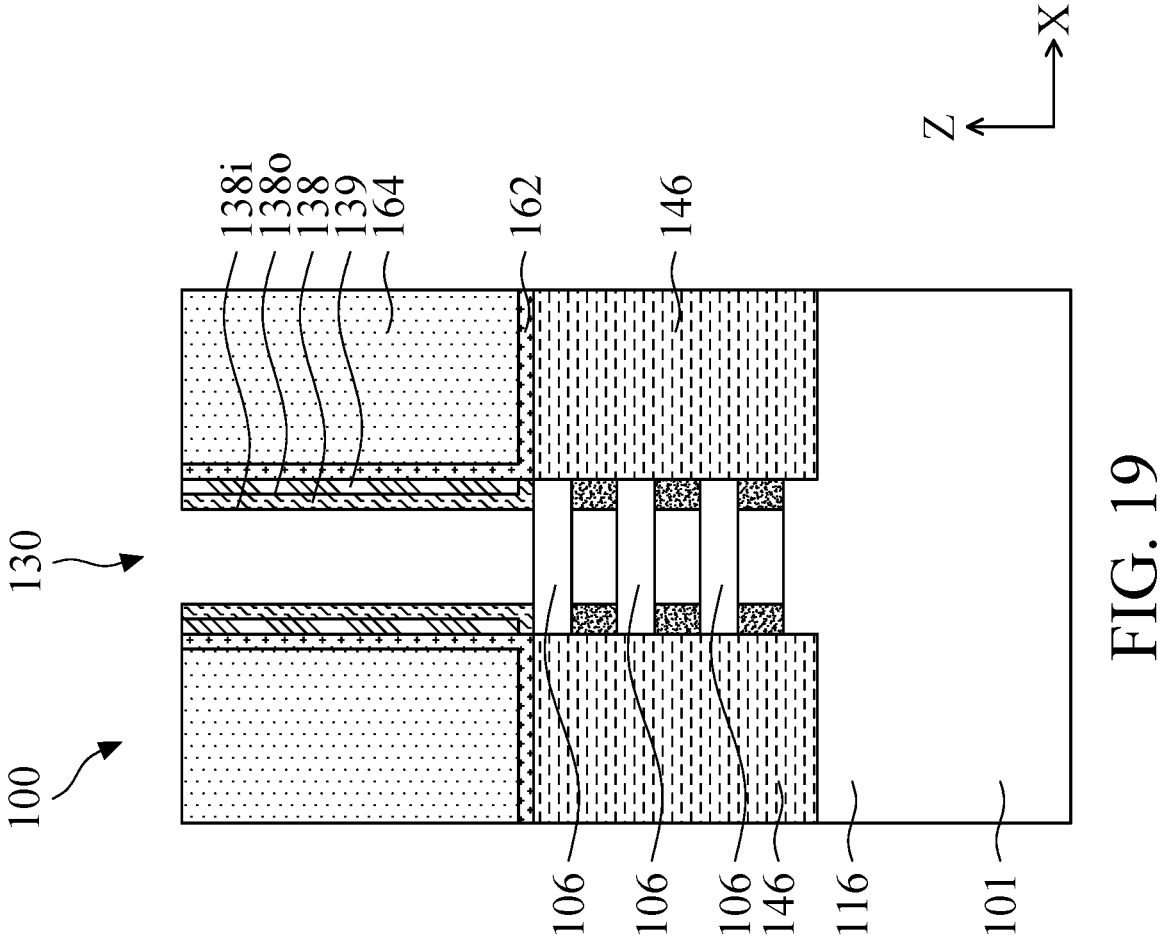
FIG. 19 is a cross-sectional view of the semiconductor device structure of FIG. 16, in accordance with alternative embodiments.

FIG. 19 is a cross-sectional view of the semiconductor device structure 100 of FIG. 16, in accordance with alternative embodiments. In some embodiments, the semiconductor device structure 100 shown in FIG. 19 is at the same stage of manufacturing as the semiconductor device structure 100 shown in FIG. 16. Alternatively, the semiconductor device structure 100 shown in FIG. 19 is at a different stage than the semiconductor device structure 100 shown in FIG. 16. For example, after the removal of the sacrificial gate structure 130, the one or more processes to incorporate fluorine into the first gate spacer 138 are not performed, and the second semiconductor layers 108 are removed. In other words, the first gate spacer 138 shown in FIG. 19 has not been fluorinated for the second time.

Figures 20A, 20B:
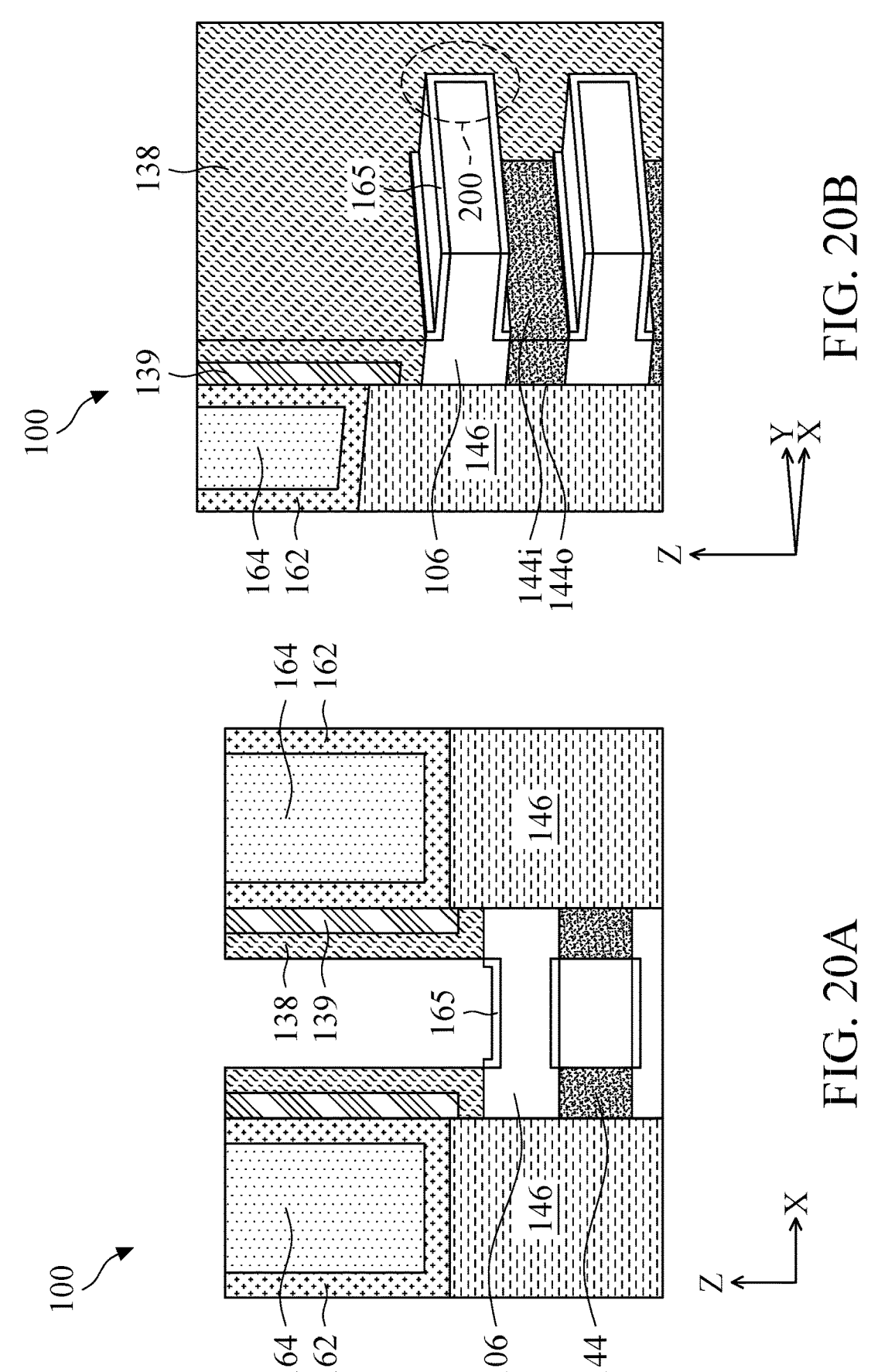
FIGS. 20A and 20B are various views of one of various stages of manufacturing the semiconductor device structure of FIG. 19, in accordance with some embodiments.

FIGS. 20A and 20B are various views of one of various stages of manufacturing the semiconductor device structure 100 of FIG. 19, in accordance with some embodiments. As shown in FIGS. 20A and 20B, the IL 165 is formed on the exposed surfaces of the first semiconductor layers 106. In some embodiments, the IL 165 is made of a chemically formed silicon oxide. After the formation of the IL 165, one or more processes are performed to fluorinate both the exposed first gate spacer 138 and the exposed dielectric spacers 144.

Figure 21:
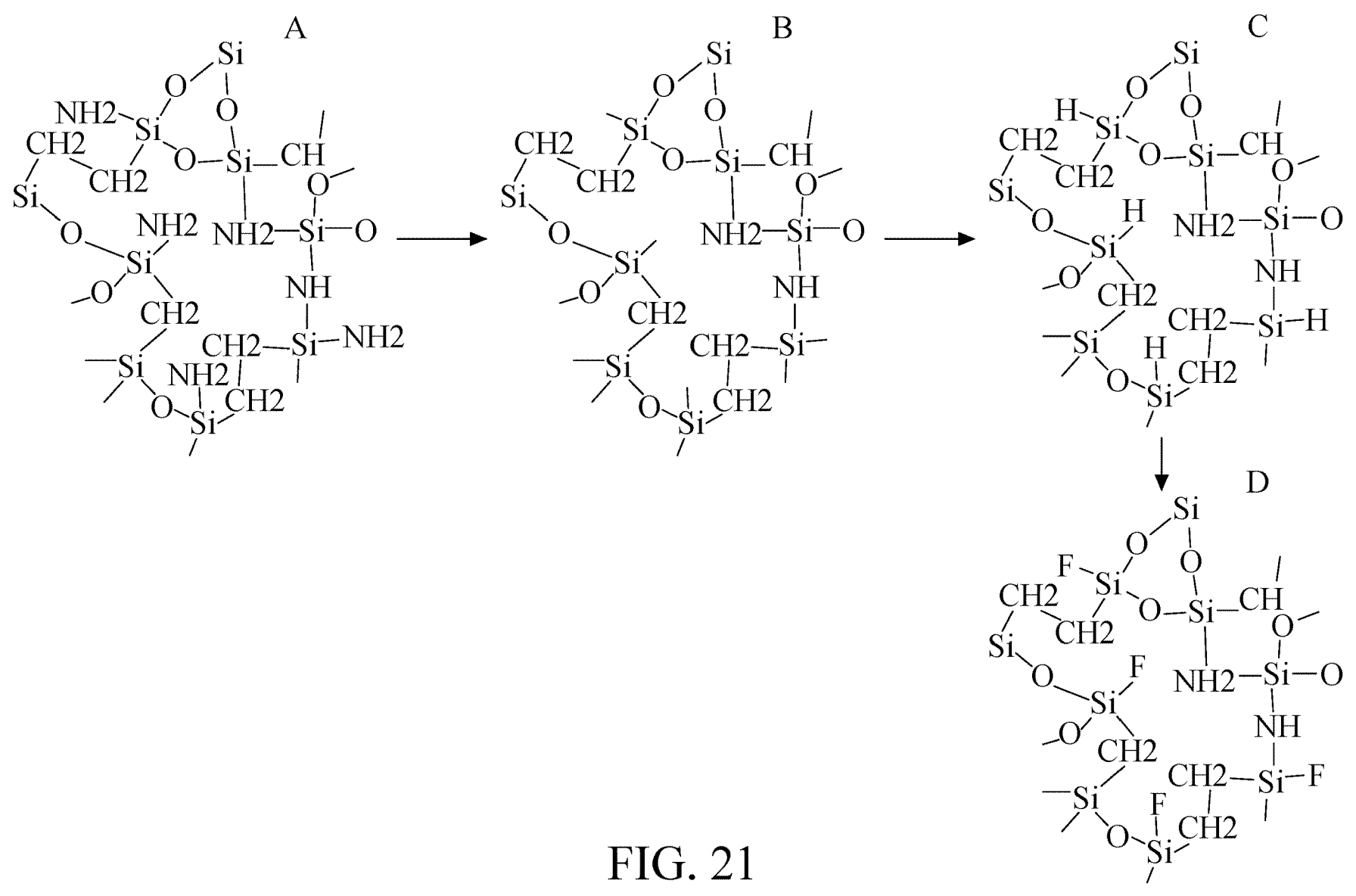

FIG. 21 illustrates fluorination of the dielectric spacer 144 of the semiconductor device structure 100, in accordance with some embodiments. In some embodiments, the dielectric spacer 144 includes SiONC and may have a chemical structure A as shown in FIG. 21. In some embodiments, the SiONC of the dielectric spacers 144 is formed by thermal ALD at a temperature ranging from about 200 degrees Celsius to about 650 degrees Celsius. The carbon concentration of the SiONC may range from about 1 atomic percent to about 10 atomic percent, and the nitrogen concentration of the SiONC may range from about 15 atomic percent to about 40 atomic percent. The dielectric spacer 144 may have a density ranging from about 2 $g/cm^3$ to about 3 $g/cm^3$. In some embodiments, a first plasma treatment process may be performed on the as-deposited dielectric spacers 144, and the chemical structure of the dielectric spacers 144 changes from chemical structure A to chemical structure B, as shown in FIG. 21. The plasma treatment process includes exposing the dielectric spacers 144 to a nitrogen-containing plasma. The nitrogen-containing plasma may be formed by activating a nitrogen-containing gas by a low power plasma source or a remote plasma source. The nitrogen-containing gas may be any suitable nitrogen-containing gas. In some embodiments, the nitrogen-containing gas is nitrogen gas ($N_2$). The treatment by the nitrogen-containing plasma removes the $NH_2$ terminal groups shown in chemical structure A and leaving the dangling Si bonds shown in chemical structure B.

Next, a second plasma treatment process may be performed on the treated dielectric spacers 144, and the chemical structure of the dielectric spacers 144 changes from chemical structure B to chemical structure C, as shown in FIG. 21. The second plasma treatment process may be the same as the plasma treatment process described in FIG. 7. In some embodiments, the second plasma treatment process includes exposing the dielectric spacers 144 to a hydrogen-containing plasma. The hydrogen-containing plasma may be formed by activating a hydrogen-containing gas by a low power plasma source or a remote plasma source. The hydrogen-containing gas may be any suitable hydrogen-containing gas. In some embodiments, the hydrogen-containing gas is hydrogen gas ($H_2$). In some embodiments, the low power plasma source is a capacitively coupled plasma source, and the plasma power ranges from about 10 W to about 250 W. The plasma generated by the capacitively coupled plasma source or the remote plasma source includes more hydrogen radicals than ions. In addition, the processing temperature of the plasma treatment process is relatively low, such as from about 20 degrees Celsius to about 100 degrees Celsius. As a result, the hydrogen radicals are attached to the dangling Si bonds to form SiH bonds, as shown in the chemical structure C in FIG. 21.

Next, a fluorination process is performed on the treated dielectric spacers 144. The fluorination process may be any suitable fluorination process. In some embodiments, the fluorination process is a fluorine soak process. The fluorine soak process may include exposing the treated dielectric spacers 144 to a fluorine-containing precursor at a processing temperature less than about 100 degrees Celsius. In some embodiments, the fluorine-containing precursor includes HF, $CF_4$, $F_2$, $C_2F_6$, a combination of HF and $F_2$, or other suitable fluorine-containing precursor. The processing temperature may range from about 20 degrees Celsius to about 99 degrees Celsius, such as from about 40 degrees Celsius to about 80 degrees Celsius, and a processing pressure may range from about 0.1 torr to about 10 torr. The treated dielectric spacers 144 may be exposed to the fluorine-containing precursor for a duration ranging from about 30 seconds to about 3600 seconds. The fluorine in the fluorine-containing precursor is more likely to break the SiH bonds than SiO, SiN, or SiC bonds under the above mentioned process conditions. Furthermore, SiNSi and SiCSi bridges remain in the dielectric spacers 144. As a result, the chemical structure of the dielectric spacers 144 changes from the chemical structure C to a chemical structure D shown in FIG. 21. The hydrogen atoms attached to Si are replaced with fluorine atoms. The SiF bonds have lower polarization, which can reduce K values. In addition, SiNSi and SiCSi bridges remain in the dielectric spacers 144 can keep the etch resistance high. Because of the SiH bonds generated by the plasma treatment processes, the fluorination process may be performed with relatively low energy, such as at a low temperature without plasma. Low energy fluorination process may avoid causing the fluorine-containing precursor to become an etchant.

Figure 22:
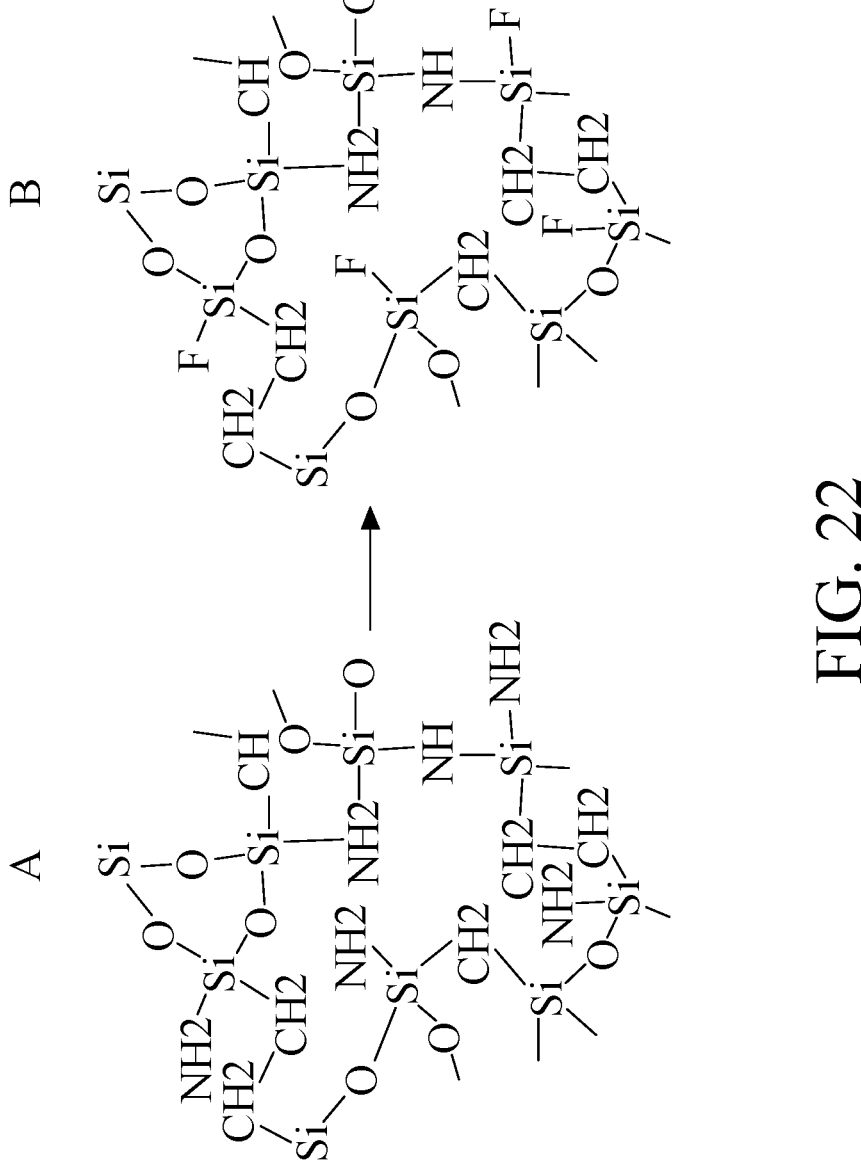
FIG. 22 illustrates fluorination of the dielectric spacer of the semiconductor device structure, in accordance with alternative embodiments.

FIG. 22 illustrates fluorination of the dielectric spacer 144 of the semiconductor device structure 100, in accordance with alternative embodiments. In some embodiments, the first and second plasma treatments are not performed, and the fluorination process is performed for a longer period of time and/or with higher energy and temperature. As a result, the chemical structure of the dielectric spacers 144 changes from the chemical structure A to the chemical structure B shown in FIG. 22. In some embodiments, the fluorination process without the first and second plasma treatments is the same as the fluorination process performed with the first and second plasma treatments, except the duration of the fluorination process without the first and second plasma treatments is much longer, such as about two times to about 10 times longer, than the duration of the fluorination process with the first and second plasma treatments. In some embodiments, the fluorination process without the first and second plasma treatments is the same as the fluorination process with higher energy and temperature as described in FIG. 7.

Figure 23:
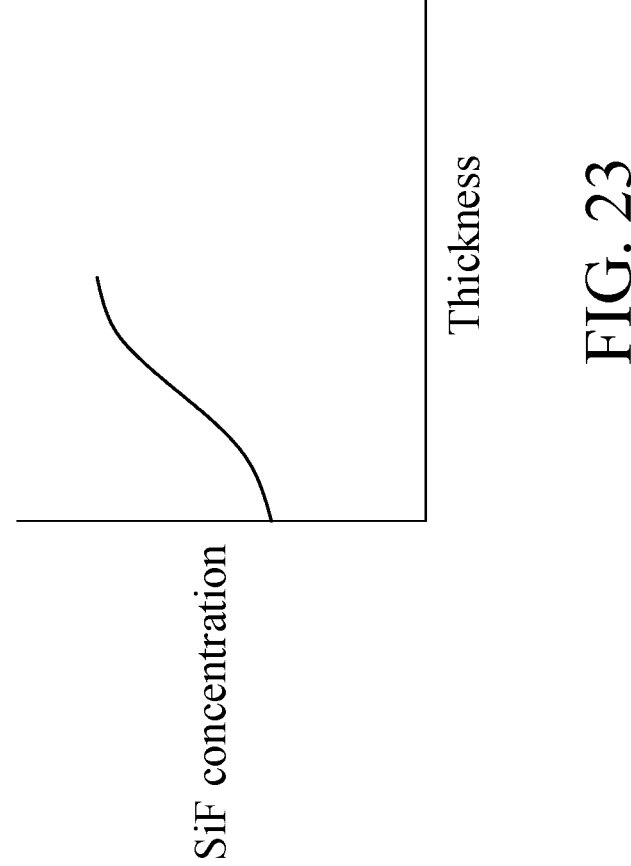
FIG. 23 is a chart showing SiF concentration profile in the dielectric spacer, in accordance with some embodiments.

After the fluorination process, the dielectric spacer 144 may include about one atomic percent to about six atomic percent of fluorine. The fluorine diffusion depth may range from at the surface to about 100 Angstroms. FIG. 23 is a chart showing SiF concentration profile in the dielectric spacer 144, in accordance with some embodiments. As shown in FIG. 23, the fluorine concentration (measured in terms of SiF concentration) profile in the dielectric spacer 144 is illustrated. The minimum value on the X axis represents the location of an outer surface 1440 (FIG. 20B) of the dielectric spacer 144, and the maximum value on the X axis represents the location of the inner surface 144i (FIG. 20B) of the dielectric spacer 144. The fluorine concentration is the lowest at the outer surface 1440 and is the highest at the inner surface 144i.

In some embodiments, the fluorinated dielectric spacer 144 has an outgassing temperature of about 400 degrees Celsius and thermal stability at about 600 degrees Celsius to about 750 degrees Celsius with $N_2$ and $H_2$. Unstable fluorine bonds in the fluorinated dielectric spacers 144 are driven out (outgassing) at an outgassing temperature ranging from about 20 degrees Celsius to about 400 degrees Celsius, and the remaining fluorine bonds in the fluorinated dielectric spacers 144 are stable at a temperature up to about 750 degrees Celsius, such as from about 600 degrees Celsius to about 750 degrees Celsius. In some embodiments, as described above, the $NH_2$ terminal groups of the as-deposited dielectric spacers 144 are removed by the first plasma treatment process. In some embodiments, the first plasma treatment process is not performed, and the $NH_2$ terminal groups of the as-deposited dielectric spacers 144 are not removed. Next, a fluorination process having a shorter duration than the fluorination process without the first and second plasma treatment processes are performed, and the Si—$NH_2$ bonds are converted to Si—NHF bonds. The resulting fluorinated dielectric spacers 144 have worse thermal stability compared to the dielectric spacers 144 formed by the processes described in FIGS. 21 and 22. The dielectric spacers 144 having the SiF bonds have improved thermal stability compared to the dielectric spacers 144 having Si—NHF bonds. In some embodiments, the K value of the dielectric spacer 144 having 1 atomic percent to about 5 atomic percent of fluorine formed by the processes described in FIGS. 21 and 22 is decreased by about 0.1 to about 0.5.

Figure 24:
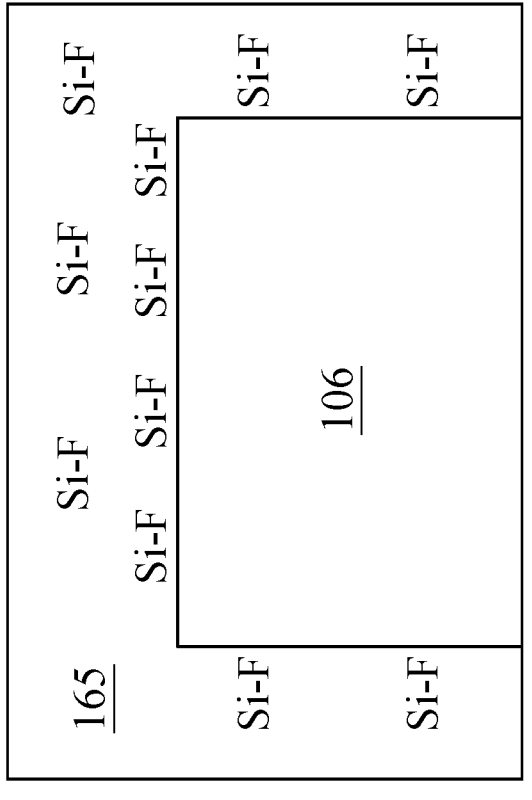
FIG. 24 illustrates a portion of the semiconductor device structure of FIG. 20B, in accordance with some embodiments.
Figure 24:
Figure 24:
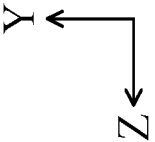

FIG. 24 illustrates a portion 200 of the semiconductor device structure 100 of FIG. 20B, in accordance with some embodiments. As shown in FIG. 24, in some embodiments, the IL 165 may be also fluorinated by the processes described in FIGS. 21 and 22, and the fluorine may diffuse to the interface between the IL 165 and the first semiconductor layer 106. Fluorine can repair defects at the interface between the IL 165 and the first semiconductor layer 106. In some embodiments, the fluorine replaces oxygen vacancies at the interface between the IL 165 and the first semiconductor layer 106, which in turn improves interfacial state density (Dit).

In some embodiments, the first gate spacer 138 is fluorinated for the first time by the processes described in FIGS. 21 and 22. In other words, the one or more processes described in FIGS. 7 and 16 are not performed to incorporate fluorine into the first gate spacer 138. In some embodiments, the first gate spacer 138 includes SiOCN having less than 5 atomic percent of nitrogen, and the dielectric spacers 144 includes SiONC having greater than about 20 atomic percent of nitrogen. After performing the processes described in FIGS. 21 and 22, the first gate spacer 138 having smaller nitrogen concentration has a smaller fluorine concentration than the dielectric spacer 144, which has a larger nitrogen concentration. Thus, in some embodiments, a dielectric layer having a larger nitrogen concentration will have a larger fluorine concentration compared to a dielectric layer having a smaller nitrogen concentration when the same fluorination process is performed on both dielectric layers. In some embodiments, the fluorine concentration of the dielectric spacer 144 is about 35 percent to about 80 percent greater than the fluorine concentration of the first gate spacer 138.

In some embodiments, the first gate spacer 138 is fluorinated for the second time by the processes described in FIGS. 21 and 22. In other words, the one or more processes described in FIG. 16 are not performed to incorporate additional fluorine into the first gate spacer 138. As a result, the fluorine concentration of the first gate spacer 138 is substantially greater than the fluorine concentration of the dielectric spacers 144.

In some embodiments, the first gate spacer 138 is fluorinated for the third time by the processes described in FIGS. 21 and 22. In other words, the one or more processes described in FIGS. 7 and 16 are performed to incorporate fluorine into the first gate spacer 138. As a result, the fluorine concentration of the first gate spacer 138 is substantially greater than the fluorine concentration of the dielectric spacers 144.

In some embodiments, the fluorination of the first gate spacer 138, the second gate spacer 139, and/or the dielectric spacers 144 described in FIGS. 7, 14, 16, 21, and 22 may be enhanced by keeping the fluorinated layers in nitrogen environment immediately after the fluorination process, exposing the fluorinated layers in a water-free environment immediately after the fluorination process, and forming a capping layer on the fluorinated layers immediately after the fluorination process. For example, after the fluorination process described in FIGS. 21 and 22, the semiconductor device structure 100 is transferred to another chamber/system for subsequent processes (e.g., forming the gate dielectric layer 170) in a container that is charged with nitrogen. The subsequent process is free of water. In other words, no wet etching process may be performed immediately after the fluorination process. Immediately after the fluorination process described in FIGS. 21 and 22, the gate dielectric layer 170, which functions as a capping layer for the fluorinated first gate spacer 138 and the dielectric spacers 144, is formed on the fluorinated first gate spacer 138 and the dielectric spacers 144. With these enhancements, the fluorine concentration in the fluorinated layers is substantially higher compared to fluorinated layers without the enhancements.

After performing the processes described in FIGS. 21 and 22 to fluorinate the dielectric spacers 144, the processes described in FIG. 17 may be performed to complete the semiconductor device structure 100.

Embodiments of the present disclosure provide a semiconductor device structure including a first gate spacer 138, a second gate spacer 139, and dielectric spacers 144. The first gate spacer 138, the second gate spacer 139, and the dielectric spacers 144 are fluorinated at different stages of manufacturing the semiconductor device structure 100. Some embodiments may achieve advantages. For example, by performing the fluorinated processes at different stages of manufacturing the semiconductor device structure 100, other components of the semiconductor device structures 100 are protected. In addition, the fluorinated first and second gate spacers 138, 139 and the fluorinated dielectric spacers 144 can lead to reduced K value, reduced leakage current, improved Dit, improved thermal stability, and reduced moisture absorption.

An embodiment is a semiconductor device structure. The structure includes a gate dielectric layer disposed over a substrate, a gate electrode layer disposed over the gate dielectric layer, and a first gate spacer disposed adjacent the gate dielectric layer. The first gate spacer includes an inner surface facing the gate dielectric layer and an outer surface opposite the inner surface, and the first gate spacer includes a fluorine concentration that decreases from the inner surface and the outer surface towards a center of the first gate spacer. The structure further includes a second gate spacer disposed on the outer surface of the first gate spacer, the second gate spacer includes an inner surface in contact with the outer surface of the first gate spacer and an outer surface opposite the inner surface, and the second gate spacer includes a fluorine concentration that decreases from the outer surface towards the inner surface.

Another embodiment is a method. The method includes forming a fin structure from a substrate, forming a sacrificial gate stack over the fin structure, depositing a first gate spacer on the sacrificial gate stack, incorporating fluorine into the first gate spacer, depositing a second gate spacer on the first gate spacer, removing portions of the fin structure to expose a portion of the substrate, forming a source/drain region from the portion of the substrate, incorporating fluorine into the second gate spacer, removing the sacrificial gate stack, and incorporating additional fluorine into the first gate spacer.

A further embodiment is a method. The method includes forming a fin structure from a substrate, and the fin structure includes a first plurality of semiconductor layers and a second plurality of semiconductor layers. The method further includes forming a sacrificial gate stack over the fin structure, depositing a gate spacer on the sacrificial gate stack, removing portions of the fin structure to expose a portion of the substrate, recessing the second plurality of semiconductor layers to form cavities; forming dielectric spacers in the cavities, forming a source/drain region from the portion of the substrate, removing the sacrificial gate stack and the second plurality of semiconductor layers, forming an interfacial layer on a portion of each of the first plurality of semiconductor layers, and incorporating fluorine into the dielectric spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:
1. A semiconductor device structure, comprising:
a gate dielectric layer disposed over a substrate;

17 a gate electrode layer disposed over the gate dielectric
layer;
a first gate spacer disposed adjacent the gate dielectric
layer, wherein the first gate spacer comprises an inner
surface facing the gate dielectric layer and an outer
surface opposite the inner surface, and the first gate
spacer includes a fluorine concentration that decreases
from the inner surface and the outer surface towards a
center of the first gate spacer; and
a second gate spacer disposed on the outer surface of the
first gate spacer, wherein the second gate spacer com-
prises an inner surface in contact with the outer surface
of the first gate spacer and an outer surface opposite the
inner surface, and the second gate spacer includes a
fluorine concentration that decreases from the outer
surface towards the inner surface.
2. The semiconductor device structure of claim 1, wherein
the first and second gate spacers each comprises SiCON.
3. The semiconductor device structure of claim 1, further
comprising a plurality of semiconductor layers disposed
over the substrate, wherein the gate electrode layer sur-
rounds a portion of each of the semiconductor layer.
4. The semiconductor device structure of claim 3, further
comprising an interfacial layer in contact with each semi-
conductor layer of the plurality of semiconductor layers,
wherein an interface between the interfacial layer and each
semiconductor layer of the plurality of semiconductor layers
comprises fluorine.
5. The semiconductor device structure of claim 3, further
comprising dielectric spacers disposed between adjacent
semiconductor layers of the plurality of semiconductor
layers.
6. The semiconductor device structure of claim 5, wherein
the dielectric spacers include a fluorine concentration sub-
stantially smaller than the fluorine concentration of the first
gate spacer.
7. A method, comprising:
forming a fin structure from a substrate;
forming a sacrificial gate stack over the fin structure;
depositing a first gate spacer on the sacrificial gate stack;
incorporating fluorine into the first gate spacer;
depositing a second gate spacer on the first gate spacer;
removing portions of the fin structure to expose a portion
of the substrate;
forming a source/drain region from the portion of the
substrate;
incorporating fluorine into the second gate spacer;
removing the sacrificial gate stack; and
incorporating additional fluorine into the first gate spacer.
8. The method of claim 7, wherein incorporating fluorine
into the first gate spacer comprises performing a plasma
treatment process on the first gate spacer followed by a
fluorine soak process on the first gate spacer.
9. The method of claim 8, wherein the plasma treatment
process comprises activating a hydrogen-containing gas to
form a hydrogen-containing plasma by a plasma source.

10. The method of claim 9, wherein the plasma source is
a remote plasma source or capacitively coupled plasma
source.
11. The method of claim 9, wherein the hydrogen-con-
taining gas comprises hydrogen gas.
12. The method of claim 8, wherein the fluorine soak
process is performed at a processing temperature less than
about 100 degrees Celsius.
13. The method of claim 12, wherein the fluorine soak
process comprises exposing the first gate spacer to fluorine
gas ($F_2$).
14. The method of claim 7, further comprising forming an
oxide layer covering the source/drain region prior to incor-
porating fluorine into the second gate.
15. The method of claim 7, further comprising removing
portions of the first and second gate spacers after incorpo-
rating fluorine into the first gate spacer and before incorpo-
rating fluorine into the second gate spacer.
16. A method, comprising:
forming a fin structure from a substrate, wherein the fin
structure comprises a first plurality of semiconductor
layers and a second plurality of semiconductor layers;
forming a sacrificial gate stack over the fin structure;
depositing a gate spacer on the sacrificial gate stack;
removing portions of the fin structure to expose a portion
of the substrate;
recessing the second plurality of semiconductor layers to
form cavities;
forming dielectric spacers in the cavities;
forming a source/drain region from the portion of the
substrate;
removing the sacrificial gate stack and the second plural-
ity of semiconductor layers;
forming an interfacial layer on a portion of each of the
first plurality of semiconductor layers; and
incorporating fluorine into the dielectric spacers.
17. The method of claim 16, wherein the incorporating
fluorine into the dielectric spacers comprises;
performing a first plasma treatment process on the dielec-
tric spacers;
performing a second plasma treatment process on the
dielectric spacers; and
performing a fluorine soak process on the dielectric
spacers.
18. The method of claim 17, wherein the first plasma
treatment process comprises exposing the dielectric spacers
to a nitrogen-containing plasma.
19. The method of claim 18, wherein the first plasma
treatment process comprises exposing the dielectric spacers
to a hydrogen-containing plasma.
20. The method of claim 16, further comprising incorpo-
rating fluorine into the gate spacer during the incorporating
fluorine into the dielectric spacers.

* * * * *